United States Patent
Bessho et al.

(10) Patent No.: US 8,064,492 B2
(45) Date of Patent: Nov. 22, 2011

(54) METHOD OF MANUFACTURING SEMICONDUCTOR LASER DEVICE, SEMICONDUCTOR LASER DEVICE AND LIGHT APPARATUS

(75) Inventors: Yasuyuki Bessho, Uji (JP); Hiroki Ohbo, Hirakata (JP); Kunio Takeuchi, Joyo (JP); Seiichi Tokunaga, Toyonaka (JP); Yasumitsu Kunoh, Tottori (JP); Masayuki Hata, Takatsuki (JP)

(73) Assignee: Sanyo Electric Co., Ltd., Osaka (JP)

( * ) Notice: Subject to any disclaimer, the term of this patent is extended or adjusted under 35 U.S.C. 154(b) by 39 days.

(21) Appl. No.: 12/693,169

(22) Filed: Jan. 25, 2010

(65) Prior Publication Data

US 2010/0189146 A1    Jul. 29, 2010

(30) Foreign Application Priority Data

Jan. 26, 2009  (JP) ................. 2009-014478
Apr. 22, 2009  (JP) ................. 2009-103507
Jan. 18, 2010  (JP) ................. 2010-007892

(51) Int. Cl.
*H01S 5/00*    (2006.01)

(52) U.S. Cl. ............... 372/43.01; 372/50.1; 372/50.121; 372/50.23

(58) Field of Classification Search ............... 372/43.01, 372/50.1, 50.121
See application file for complete search history.

(56) References Cited

U.S. PATENT DOCUMENTS

2005/0220159 A1    10/2005  Bessho et al.
2007/0099321 A1*   5/2007   Miyachi et al. ................. 438/28
2010/0054292 A1*   3/2010   Bessho ....................... 372/49.01

FOREIGN PATENT DOCUMENTS

JP    2005-317919 A    11/2005
JP    2005-327905 A    11/2005

* cited by examiner

*Primary Examiner* — Dung Nguyen
(74) *Attorney, Agent, or Firm* — Ditthavong Mori & Steiner, P.C.

(57) ABSTRACT

A method of manufacturing a semiconductor laser device comprises steps of forming a first semiconductor laser device substrate having first grooves for cleavage on a surface thereof, bonding a second semiconductor laser device substrate onto the surface side having the first grooves and thereafter cleaving the first and second semiconductor laser device substrates along at least the first grooves.

3 Claims, 19 Drawing Sheets

METHOD OF MANUFACTURING SEMICONDUCTOR LASER DEVICE, SEMICONDUCTOR LASER DEVICE AND LIGHT APPARATUS

CROSS-REFERENCE TO RELATED APPLICATIONS

The priority application number JP2009-014478, Method of Manufacturing Semiconductor Laser Device and Semiconductor Laser Device, Jan. 26, 2009, Yasuyuki Bessho et al, JP2009-103507, Method of Manufacturing Semiconductor Laser Device, Apr. 22, 2009, Yasuyuki Bessho et al, JP2010-7892, Method of Manufacturing Semiconductor Laser Device, Semiconductor Laser Device and Light Apparatus, Jan. 18, 2010, Yasuyuki Bessho et al, upon which this patent application is based is hereby incorporated by reference.

BACKGROUND OF THE INVENTION

1. Field of the Invention

The present invention relates to a method of manufacturing a semiconductor laser device, a semiconductor laser device, and a light apparatus, and more particularly, it relates to a method of manufacturing a semiconductor laser device formed by bonding a first semiconductor laser device and a second semiconductor laser device, a semiconductor laser device and a light apparatus.

2. Description of the Background Art

A method of manufacturing a semiconductor laser device formed by bonding a first semiconductor laser device and a second semiconductor laser device is known in general, as disclosed in Japanese Patent Laying-Open No. 2005-327905, for example.

The aforementioned Japanese Patent Laying-Open No. 2005-327905 discloses a semiconductor light-emitting device (semiconductor laser device) comprising a first light-emitting element bonded onto a support base and a second light-emitting element bonded onto a surface of a semiconductor layer of the first light-emitting element and formed with a first element and a second element. This semiconductor light-emitting device described in Japanese Patent Laying-Open No. 2005-327905 is provided with notch grooves on a semiconductor layer of the first light-emitting element opposed to a light-emitting point of the first element and a light-emitting point of the second element. This pair of notch grooves can inhibit light from the light-emitting points of the first and second elements from being radiated in an undesirable direction by reflection on the semiconductor layer of the first light-emitting element. In a method of manufacturing the semiconductor light-emitting device, the semiconductor light-emitting device is formed by bonding the first and second light-emitting elements each previously worked into a chip.

In the aforementioned semiconductor light-emitting device disclosed in Japanese Patent Laying-Open No. 2005-327905, however, since the first and second light-emitting elements each previously worked into a chip are bonded to each other, it is disadvantageously difficult to locate a cavity facet (light-emitting surface) of the first light-emitting element and a cavity facet of the second light-emitting element on the same surface.

SUMMARY OF THE INVENTION

A method of manufacturing a semiconductor laser device according to a first aspect of the present invention comprises steps of forming a first semiconductor laser device substrate having first grooves for cleavage on a surface thereof, bonding a second semiconductor laser device substrate onto the surface having the first grooves and thereafter cleaving the first and second semiconductor laser device substrates along at least the first grooves to form cleavage planes on the first and second semiconductor laser device substrates.

As hereinabove described, the method of manufacturing a semiconductor laser device according to the first aspect of the present invention comprises the steps of bonding the second semiconductor laser device substrate onto the surface having the first grooves and thereafter cleaving the first and second semiconductor laser device substrates along at least the first grooves to form the cleavage planes on the first and second semiconductor laser device substrates, whereby the first and second semiconductor laser device substrates are simultaneously cleaved in a state where the second semiconductor laser device substrate is bonded onto the surface side, having the first grooves, of the first semiconductor laser device substrate, and hence cavity facets consisting of cleavage planes can be simultaneously formed on the first and second semiconductor laser device substrates. Thus, the cavity facets of the first semiconductor laser device substrate and the cavity facets of the second semiconductor laser device substrate can be easily located on the same surface. Each of the "first semiconductor laser device substrate" and the "second semiconductor laser device substrate" shows a state before dividing the semiconductor laser device, and includes both of a substrate in a state where a semiconductor device layer is not formed on the substrate and a substrate in a state where the semiconductor device layer is formed on the substrate.

In the aforementioned method of manufacturing a semiconductor laser device according to the first aspect, the step of forming the first semiconductor laser device substrate having the first grooves on the surface thereof preferably includes a step of forming the first grooves in the form of broken lines on a region except waveguides of the first semiconductor laser device substrate and the vicinity thereof. According to this structure, the first grooves are formed on positions separated from the waveguides of the first semiconductor laser device substrate which are light-emitting portions and regions in the vicinity thereof, and hence the waveguides of the first semiconductor laser device substrate can be inhibited from being damaged also when the first grooves are formed. The first grooves can be formed to extend on an substantially overall area except the waveguides of the first semiconductor laser device substrate and the vicinity thereof, and hence the first and second semiconductor laser device substrates can be more reliably cleaved.

In the aforementioned structure including the step of forming the first grooves in the form of the broken lines, the step of forming the first semiconductor laser device substrate preferably includes a step of forming the first grooves in a direction substantially perpendicular to an extensional direction of the waveguides. According to this structure, the first and second semiconductor laser device substrates can be cleaved along the direction substantially perpendicular to the extensional direction of the waveguides by the first grooves, and hence the cavity facets consisting of the cleavage planes substantially perpendicular to the waveguides can be easily formed.

In the aforementioned structure including the step of forming the first grooves in the form of the broken lines, the first semiconductor laser device substrate preferably includes a first substrate and a first semiconductor device layer formed on a surface of the first substrate, and the step of forming the first semiconductor laser device substrate preferably includes a step of forming the first grooves each having a depth reaching the first substrate from the surface of the first semiconductor device layer. According to this structure, the thickness of the first substrate formed with no the first grooves is further reduced due to the first grooves each having the depth reaching the first substrate from the surface of the first semiconductor device layer also when the first semiconductor laser device substrate is formed by a nitride-based semiconductor which is generally difficult to be cleaved, for example, and hence the first semiconductor laser device substrate made of the nitride-based semiconductor can be more easily cleaved.

In the aforementioned structure including the step of forming the first grooves in the form of the broken lines, the step of forming the first semiconductor laser device substrate preferably includes a step of forming the first grooves so that at least first ends of the first grooves have wedge shapes in plan view. According to this structure, cracks are easily formed on sections from the first ends of the first grooves to the ends of the first grooves adjacent thereto when cleaving the first semiconductor laser device substrate, and hence the first and second semiconductor laser device substrates can be easily cleaved.

The aforementioned method of manufacturing a semiconductor laser device according to the first aspect preferably further comprises a step of forming second grooves on the second semiconductor laser device substrate at positions overlapping with regions formed with the first grooves in plan view after the step of bonding the second semiconductor laser device substrate, wherein the step of cleaving along the first grooves includes a step of cleaving the first and second semiconductor laser device substrates simultaneously along the first and second grooves. According to this structure, the first and second semiconductor laser device substrates can be cleaved simultaneously along the first and second grooves, and hence the first and second semiconductor laser device substrates can be more reliably cleaved as compared with a case where only the first grooves are cleaved. Thus, the more excellent cavity facets (cleavage planes) can be obtained not only on the first semiconductor laser device substrate also on the second semiconductor laser device substrate.

In the aforementioned structure further comprising the step of forming the second grooves, the step of forming the second grooves preferably includes a step of forming the second grooves on a surface on an opposite side of the second semiconductor laser device substrate to the first semiconductor laser device substrate. According to this structure, positions of the second grooves formed on the second semiconductor laser device substrate can be easily recognized, and hence pressing force for simultaneously cleaving the first and second semiconductor laser device substrates can be suitably applied while confirming the positions of the second grooves.

In the aforementioned structure further comprising the step of forming the second grooves, the step of forming the second grooves preferably includes a step of forming the second grooves in the vicinity of ends of the second semiconductor laser device substrate. According to this structure, the second semiconductor laser device substrate can be easily cleaved, and the cavity facets of the first and second semiconductor laser device substrates can be inhibited from being deviated in a cavity direction due to deviation of the first and second grooves when the second grooves are formed on an overall surface of the second semiconductor laser device substrate.

In the aforementioned structure further comprising the step of forming the second grooves, the step of forming the second grooves preferably includes a step of forming the second grooves in the form of broken lines on the second semiconductor laser device substrate. According to this structure, the second grooves can be formed in the form of the broken lines on a substantially overall area of the second semiconductor laser device substrate along an extensional direction of the first grooves. Therefore, regions formed with the second grooves are increased and hence the second semiconductor laser device substrate can be more easily cleaved.

The aforementioned method of manufacturing a semiconductor laser device according to the first aspect preferably further comprises a step of removing needless regions consisting of one part of the second semiconductor laser device substrate after the step of cleaving along the first grooves. According to this structure, device division can be performed on the portion of only the first semiconductor laser device substrate where no second semiconductor laser device substrate exists when the wafer after removing the needless regions consisting of the one part of the second semiconductor laser device substrate is divided into chips in subsequent steps, and hence a chip of the multiple wavelength semiconductor laser device can be easily obtained.

In the aforementioned structure further comprising the step of removing the needless regions, the step of removing the needless regions preferably includes a step of removing the needless regions simultaneously when the first and second semiconductor laser device substrates bonded to each other are divided into chips. According to this structure, the needless regions are removed simultaneously when the wafer where the first and second semiconductor laser device substrates are bonded is divided into chips, and hence the manufacturing process can be simplified as compared with a case where the step of dividing the wafer into chips and the step of removing the needless regions are separately performed.

The aforementioned structure further comprising the step of removing the needless regions preferably further comprises a step of forming protective films on the cleavage planes in advance of the step of removing the needless regions. According to this structure, the wafer in which the first and second semiconductor laser device substrates are bonded to each other is formed with protective films (insulating films) on the cavity facets (cleavage planes) in a state where the wafer has a substantially uniform thickness. Thus, a disadvantage that the electrode layer is insulated by the protective films extending toward and covering the surfaces of the exposed electrode layer does not occur dissimilarly to a case where the needless regions are removed to expose the electrode layer on the first semiconductor laser device substrate side before forming the protective films and the protective films, for example, and hence a wire bonded after division into chips and the electrode layer can be reliably electrically connected (wire-bonded).

The aforementioned structure further comprising the step of removing the needless regions preferably further comprises a step of forming second grooves on the second semiconductor laser device substrate at positions overlapping with regions formed with the first grooves in plan view after the step of bonding the second semiconductor laser device substrate, wherein the step of forming the second grooves includes a step of forming the second grooves on the needless regions. According to this structure, only cavity facets consisting of cleavage planes employing the second grooves removed together with the needless regions as starting points of cracks can be easily formed on regions remaining on a chip of the second semiconductor laser device substrate, dissimilarly to a case where the second grooves remain the regions remaining on the chip of the second semiconductor laser device substrate.

The aforementioned structure further comprising the step of removing the needless regions preferably further comprises steps of forming first device division grooves on the first semiconductor laser device substrate and forming second device division grooves for removing the needless regions on a surface of the second semiconductor laser device substrate, in advance of the step of removing the needless regions. According to this structure, the second semiconductor laser device substrate can be also divided on positions formed with the second device division grooves into regions remaining on the chips and regions removed from the chips in response to division of the first semiconductor laser device substrate on the portions of the first device division grooves when dividing the wafer. Thus, the needless regions can be easily removed while the wafer is simultaneously divided into chips In this case, the method preferably further comprises a step of forming third device division grooves at positions overlapping with regions formed with the second device division grooves in plan view on a surface on an opposite side of the second semiconductor laser device substrate to the surface of the second semiconductor laser device substrate formed with the second device division grooves, in advance of the step of bonding the second semiconductor laser device substrate. According to this structure, in the second semiconductor laser device substrate, the wafer (substrate) is easily partially divided not only by the second device division grooves but the third device division grooves, and hence the needless regions can be more easily removed.

In the aforementioned structure further comprising the step of removing the needless regions, an electrode layer is preferably formed on a surface of the first semiconductor laser device substrate on a side bonded with the second semiconductor laser device substrate, and the electrode layer is formed to be exposed by the step of removing the needless regions. According to this structure, a wire can be easily bonded onto the portion of the electrode layer exposed on the surface of the first semiconductor laser device substrate by partially removing the second semiconductor laser device substrate.

In the aforementioned method of manufacturing a semiconductor laser device according to the first aspect, the second semiconductor laser device substrate preferably includes a second substrate and a second semiconductor device layer, and the step of bonding the second semiconductor laser device preferably includes a step of bonding a surface of the second semiconductor device layer of the second semiconductor laser device substrate onto the surface having the first grooves. According to this structure, the second semiconductor device layer of the second semiconductor laser device substrate can be located on the first semiconductor laser device substrate side, and hence light-emitting points of the first semiconductor laser device substrate and light-emitting points of the second semiconductor laser device substrate can be brought close to each other.

A semiconductor laser device according to a second aspect of the present invention comprises a first semiconductor laser device substrate including a first semiconductor laser device and a second semiconductor laser device substrate including a second semiconductor laser device, wherein the second semiconductor laser device is bonded onto a surface of the first semiconductor laser device, and the first semiconductor laser device includes step portions consisting of portions, each of which was a part of the groove for cleavage in a state where the first and second semiconductor laser device substrates are bonded to each other, on the surface of the first semiconductor laser device.

According to the aforementioned structure, in the semiconductor laser device according to the second aspect of the present invention, the first and second semiconductor laser device substrates which are in a bonded state are cleaved along the grooves, and hence it is possible that cavity facets of the first semiconductor laser device and cavity facets of the second semiconductor laser device are not deviated in a cavity direction. Thus, the semiconductor laser device where the cavity facets of the first semiconductor laser device and the cavity facets of the second semiconductor laser device are located on the same surface can be obtained.

In the aforementioned semiconductor laser device according to the second aspect, the step portions are preferably formed on regions except waveguides of the first semiconductor laser device and the vicinity thereof to extend along a direction substantially perpendicular to an extensional direction of the waveguides. According to this structure, in the manufacturing process, the grooves for cleavage (step portions) are formed on positions separated from the waveguides of the first semiconductor laser device substrate which are light-emitting portions and regions in the vicinity thereof when cleaving the first and second semiconductor laser device substrates which are in the bonded state along the grooves, and hence cleavage can be performed while suppressing damage to the waveguides of the first semiconductor laser device substrate. Further, the first and second semiconductor laser device substrates can be cleaved along the direction substantially perpendicular to the extensional direction of the waveguides, and hence the cavity facets consisting of cleavage planes, substantially perpendicular to the waveguides can be easily formed.

A light apparatus according to a third aspect of the present invention comprises a semiconductor laser device having a first semiconductor laser device substrate including a first semiconductor laser device and a second semiconductor laser device substrate including a second semiconductor laser device, and an optical system controlling a light emitted from the semiconductor laser device, wherein the second semiconductor laser device is bonded onto a surface of the first semiconductor laser device, and the first semiconductor laser device has step portions consisting of portions, each of which was a part of the groove for cleavage in a state where the first and second semiconductor laser device substrates are bonded to each other, on the surface of the first semiconductor laser device.

According to the aforementioned structure, in the light apparatus according to the third aspect of the present invention, the semiconductor laser device can be formed by cleaving the first and second semiconductor laser device substrates which are in a bonded state along the grooves can be formed, and hence, it is possible that the cavity facets of the first semiconductor laser device and the cavity facets of the second semiconductor laser device are not deviated in a cavity direction. Thus, the light apparatus comprising the semiconductor laser device where the cavity facets of the first semiconductor laser device and the cavity facets of the second semiconductor laser device are located on the same surface can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

First Embodiment

Figure 1:
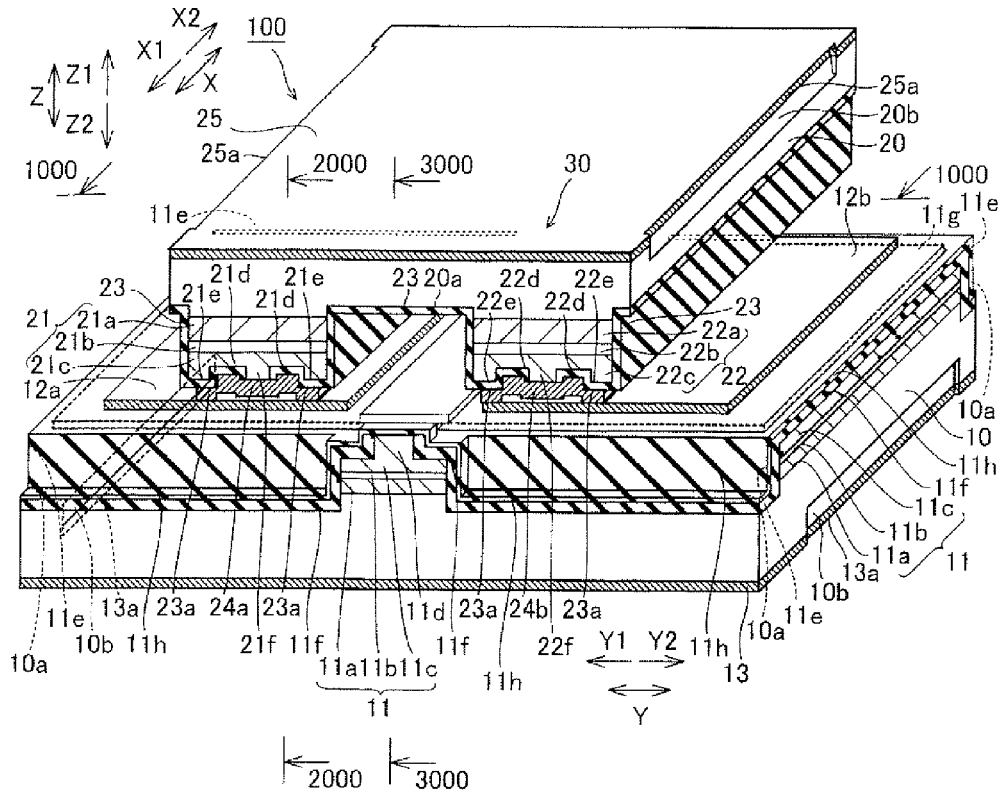
FIG. 1 is a perspective view showing a structure of a semiconductor laser device formed by a manufacturing method according to a first embodiment of the present invention.
Figure 2:
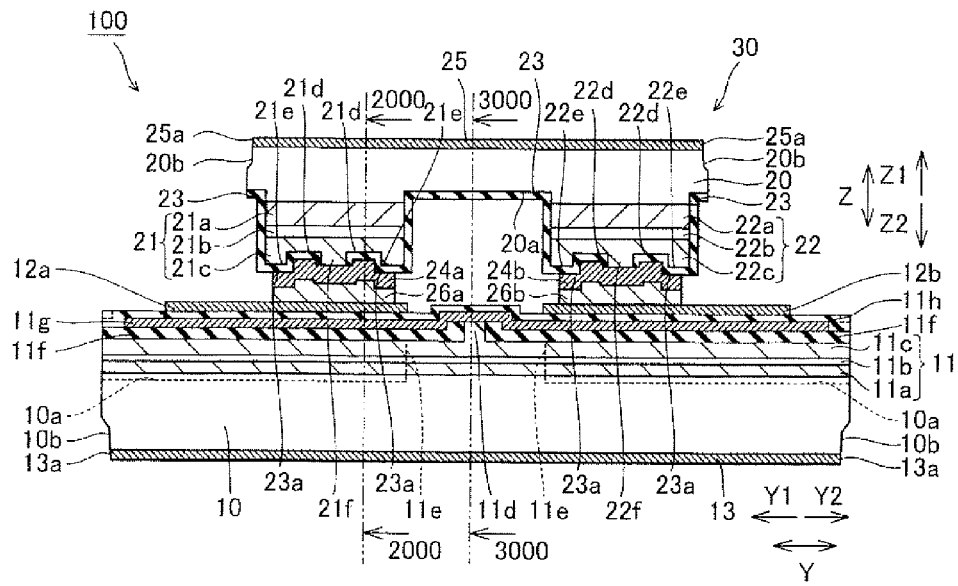
FIG. 2 is a sectional view taken along the line 1000-1000 of the semiconductor laser device shown in FIG. 1.
Figure 3:
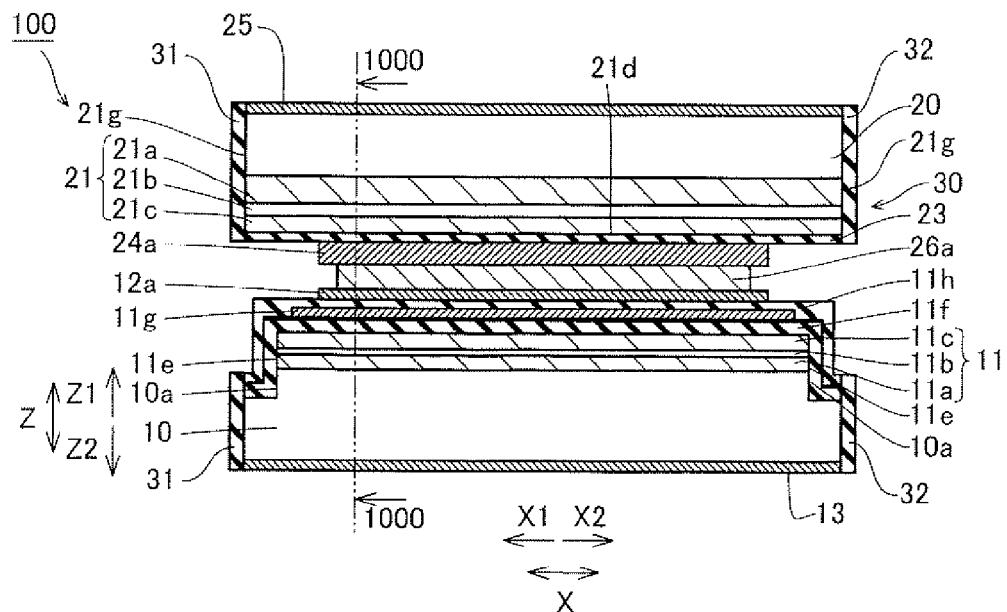
FIG. 3 is a sectional view taken along the line 2000-2000 of the semiconductor laser device shown in FIG. 1.
Figure 4:
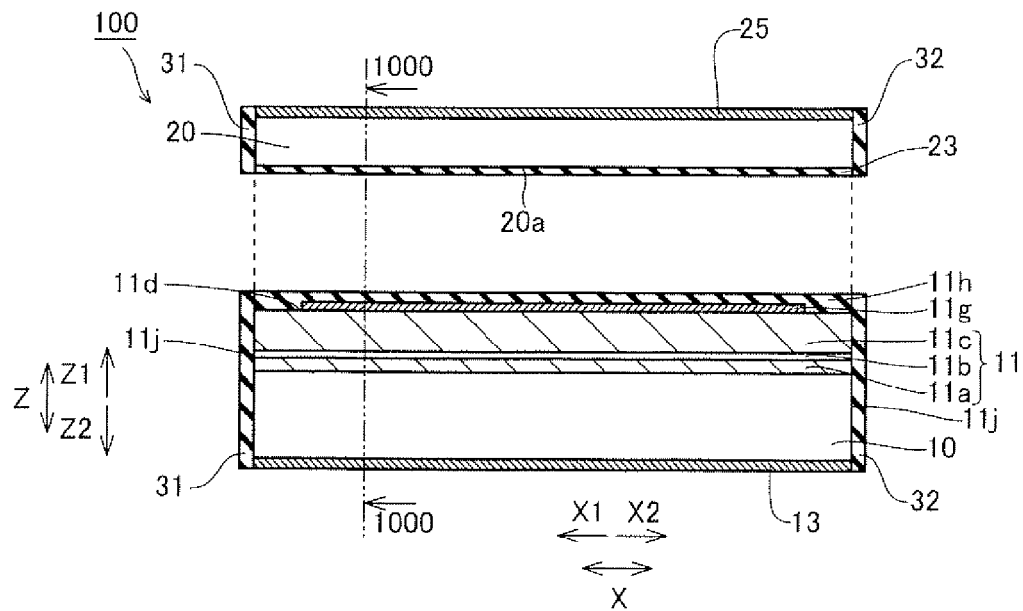
FIG. 4 is a sectional view taken along the line 3000-3000 of the semiconductor laser device shown in FIG. 1.
Figure 5:
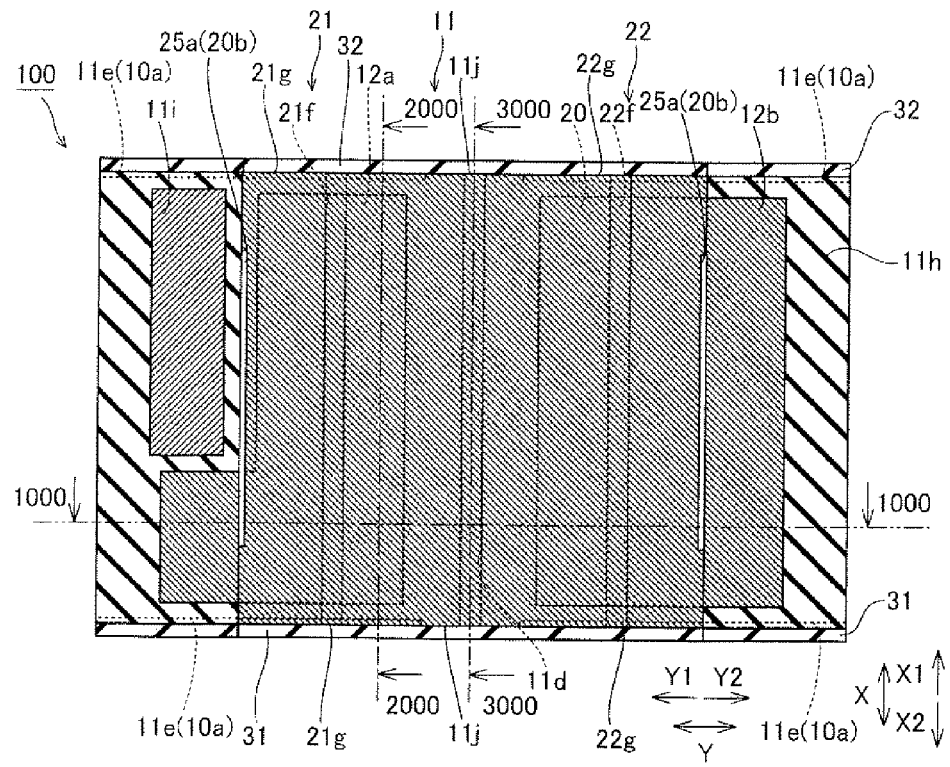
FIG. 5 is a top plan view showing the structure of a semiconductor laser device formed by the manufacturing method according to the first embodiment shown in FIG. 1.

A structure of a semiconductor laser device 100 according to a first embodiment will be now described with reference to FIGS. 1 to 5. FIG. 2 is a sectional view taken along the line 1000-1000 of the semiconductor laser device shown in FIG. 1, and FIG. 3 is a sectional view taken along the line 2000-2000. FIG. 4 is a sectional view taken along the line 3000-3000, and FIG. 5 is a top plan view.

The semiconductor laser device 100 formed by a manufacturing method according to the first embodiment of the present invention is formed with a blue-violet semiconductor laser device portion 11 having a lasing wavelength of about 405 nm on a surface of an n-type GaN substrate 10 having a thickness of about 100 µm in a direction (direction Z) of stacking of semiconductor layers, as shown in FIGS. 1 and 2.

A two-wavelength semiconductor laser device portion 30 monolithically formed with a red semiconductor laser device portion 21 having a lasing wavelength of about 650 nm and an infrared semiconductor laser device portion 22 having a lasing wavelength of about 780 nm is formed on a surface of an n-type GaAs substrate 20 having a thickness of about 100 µm in the direction (direction Z) of stacking of the semiconductor layers. The red semiconductor laser device portion 21 is bonded onto an upper surface of the blue-violet semiconductor laser device portion 11 on a Y1 side and the infrared semiconductor laser device portion is bonded onto the upper surface of the blue-violet semiconductor laser device portion 11 on a Y2 side. The "first semiconductor laser device" of the present invention is constituted by the n-type GaN substrate 10 and the blue-violet semiconductor laser device portion 11, and the "second semiconductor laser device" of the present invention is constituted by the n-type GaAs substrate 20 and the two-wavelength semiconductor laser device portion comprising the red and infrared semiconductor laser device portions 21 and 22.

As shown in FIGS. 1 to 3, in the blue-violet semiconductor laser device portion 11, an n-type cladding layer 11a made of n-type AlGaN, an active layer 11b having a multiple quantum well (MQW) structure and a p-type cladding layer 11c made of p-type AlGaN are stacked on a surface of the n-type GaN substrate 10. As shown in FIGS. 1 and 2, the p-type cladding layer 11c has a projecting portion formed on a substantially central portion in a direction Y and projecting upward (in the direction Z1) and planar portions extending to both sides of the projecting portion. The projecting portion of the p-type cladding layer 11c forms a ridge 11d for constituting an optical waveguide on a portion of the active layer 11b. The ridge 11d is formed to extend in a direction X, as shown in FIGS. 1, 4 and 5.

According to the first embodiment, in the n-type GaN substrate 10 and the blue-violet semiconductor laser device portion 11, step portions 10a and 11e are formed on both ends of the n-type GaN substrate 10 and the blue-violet semiconductor laser device portion 11 on the X sides and on both side surface sides of the ridge 11d in the direction Y, respectively, as shown in FIGS. 1 and 3. These step portions 10a and 11e are portions where first cleavage guide grooves 40a remain on the n-type GaN substrate 10 and the blue-violet semiconductor laser device portion 11 after dividing a wafer-state semiconductor laser device 200 along in the direction Y (bar-shaped cleavage) in a manufacturing process described later.

As shown in FIGS. 1 and 2, a first insulating layer 11f made of SiO$_2$ is formed on the side surfaces of the ridge 11d of the p-type cladding layer 11c and the upper surfaces of the planar portions. This first insulating layer 11f is stacked also on the step portions 10a and 11e. A p-side electrode 11g is formed on an upper surface of the first insulating layer 11f. This p-side electrode 11g is provided not on an overall surface of the first insulating layer 11f and but up to the vicinity of four ends of the first insulating layer 11f (both ends in the directions X and Y). The second insulating layer 11h made of SiO$_2$ is formed on the upper surface of the p-side electrode 11g and the upper surface of the four ends of the first insulating layer 11f. This second insulating layer 11h is formed to be stacked on portions, stacked with the first insulating layer 11f, of the step portions 10a and 11e. As shown in FIG. 5, the second insulating layer 11h is partially removed on the X1 side and the Y1 side of the second insulating layer 11h, so that a wire bonding portion 11i formed by partially exposing the p-side electrode 11g is formed.

A pad electrode 12a is formed on the upper surface of the second insulating layer 11h on the Y1 side to avoid the wire bonding portion 11i of the blue-violet semiconductor laser device portion 11. A pad electrode 12b is formed on the upper surface of the second insulating layer 11h on the Y2 side. The pad electrodes 12a and 12b are each an example of the "electrode layer" in the present invention.

As shown in FIGS. 1 to 3, an n-side electrode 13 is formed on an overall lower surface of the n-type GaN substrate 10. Step portions 10b and 13a are formed on both ends of the lower surface of the n-type GaN substrate 10 on the Y sides and both ends of the n-side electrode 13 on the Y sides, respectively. These step portions 10b and 13a are portions where device division grooves 60c remain on the n-type GaN substrate 10 and the n-side electrode 13 after performing device division of a bar-shaped semiconductor laser device 300 along the direction X (in the form of chips) in a manufacturing process described later. The device division groove 60c is an example of the "first device division groove" in the present invention.

In the red semiconductor laser device portion 21 constituting the two-wavelength semiconductor laser device portion 30, an n-type cladding layer 21a made of n-type AlGaInP, an active layer 21b having an MQW structure and a p-type cladding layer 21c made of p-type AlGaInP are stacked on a lower surface of the n-type GaAs substrate 20 on the Y1 side. In the infrared semiconductor laser device portion 22, an n-type cladding layer 22a made of n-type AlGaAs, an active layer 22b having an MQW structure and a p-type cladding layer 22c made of p-type AlGaAs are stacked on a lower surface of the n-type GaAs substrate 20 on the Y2 side. As shown in FIGS. 1, 2 and 4, a groove 20a is formed between the red semiconductor laser device portion 21 and the infrared semiconductor laser device portion 22 (central portion in the direction Y).

The p-type cladding layers 21c and 22c have projecting portions formed on substantially central portions in the direction Y and projecting downward (in a direction Z2), recess portions 21d and 22d formed on both sides of the projecting portions and planar portions 21e and 22e extending to both sides of the recess portions 21d and 22d, respectively. The projecting portion of the p-type cladding layers 21c and 22c form ridges 21f and 22f for constituting optical waveguides on portions of the active layers 21b and 22b, respectively. The ridges 21f and 22f are formed to extend in the direction X, as shown in FIGS. 1 and 5.

As shown in FIGS. 1 and 2, an insulating layer 23 made of SiO$_2$ is formed on lower surfaces of the p-type cladding layers 21c and 22c except lower surfaces of ridges 21f and 22f, side surfaces of the red and infrared semiconductor laser device portions 21 and 22, and a lower surface of the groove 20a of the n-type GaAs substrate 20. The insulating layer 23 have a substantially uniform thickness and is formed also on inner surfaces (upper and side surfaces) of the recess portions 21d and 22d of the p-type cladding layers 21c and 22c, respectively. Thus, the insulating layer 23 has recess portions formed on the both sides of the ridges 21f and 22f and planar portions 23a extending to the both sides of the recess portions so as to correspond to the p-type cladding layers 21c and 22c.

The planar portions 23a are formed to be located below the lower surfaces (surfaces on the Z2 side) of the ridges 21f and 22f formed with no insulating layer 23. Thus, excessive pressure can be inhibited from being applied to the ridges 21f and 22f when bonding the red and infrared semiconductor laser device portions 21 and 22 onto the blue-violet semiconductor laser device portion 11.

A p-side electrode 24a is formed on the lower surface of the ridge 21f and a lower surface of the insulating layer 23 located around the ridge 21f. A p-side electrode 24b is formed on the lower surface of the ridge 22f and a lower surface of the insulating layer 23 located around the ridge 22f. Each of the p-side electrodes 24a and 24b is formed to have unevenness by having a substantially uniform thickness.

An n-side electrode 25 is formed on an upper surface of the n-type GaAs substrate 20. This n-side electrode 25 is formed to be employed for the red and infrared semiconductor laser device portions 21 and 22 in common. Step portions 20b and 25a are formed on both ends of upper surfaces of the n-type GaAs substrate 20 and the n-side electrode 25 on the Y sides. These step portions 20b and 25a are portions where device division grooves 60b remain on the n-type GaAs substrate 20 and the n-side electrode after performing device division of the bar-shaped semiconductor laser device 300 along in the direction X (in the form of chips) in a manufacturing process described later. The device division groove 60b is an example of the "second device division groove" in the present invention.

The p-side electrodes 24a and 24b are bonded onto upper surfaces of the pad electrodes 12a and 12b through fusion layers 26a and 26b (see FIG. 2) made of Au—Sn solder, respectively. The step portions 10a and 11e formed on the n-type GaN substrate 10 and the blue-violet semiconductor laser device portion 11 are formed to extend up to portions located below (in the direction Z2) a position formed with the red or infrared semiconductor laser device portion 21 or 22.

According to the first embodiment, pairs of cavity facets 11j, 21g and 22g are formed on both ends of the blue-violet, red and infrared semiconductor laser device portions 11, 21 and 22 on the X sides so as to be flat surfaces perpendicular to the ridges 11d, 21f and 22f (flat surfaces formed by the directions Y and Z), respectively, as shown in FIG. 5. The cavity facets 11j, 21g and 22g on the X1 sides are formed on the same flat surface and the cavity facets 11j, 21g and 22g on the X2 sides are formed on the same flat surface. A dielectric film 31 and dielectric multilayer films 32 having a function of reflectance control and made of $Al_2O_3$, $SiO_2$, and $TiO_2$ are formed on the cavity facets 11j, 21g and 22g by facet coating treatment in the manufacturing process. FIG. 1 shows the semiconductor laser device 100 in a state where the aforementioned dielectric film 31 and dielectric multilayer films 32 are not illustrated, for simplification of the drawing.

The dielectric film 31 formed on the cavity facets 11j, 21g and 22g on the X1 side is constituted by an $Al_2O_3$ film having a thickness of about 330 nm formed on the cavity facets 11j, 21g and 22g. The dielectric multilayer film 32 formed on the cavity facets on the X2 side is constituted by a multilayer reflecting film formed by alternately stacking two $SiO_2$ films each having a thickness of about 120 nm and two $TiO_2$ films each having a thickness of about 75 nm, alternately stacking three $SiO_2$ films each having a thickness of about 70 nm and three $TiO_2$ films each having a thickness of about 43 nm, and alternately stacking an $SiO_2$ film having a thickness of about 70 nm and a $TiO_2$ film having a thickness of about 40 nm from the cavity facets toward outside, and having a thickness of about 839 nm in total. In this case, the cavity facets 11j, 21g and 22g on the X1 side of the semiconductor laser device 100 function as a light-emitting surface having relatively larger strength of the emitted laser beam and the cavity facets 11j, 21g and 22g on the X2 side functions as a light-reflecting surface having relatively smaller strength of the emitted laser beam.

The process of manufacturing the semiconductor laser device 100 according to the first embodiment will be now described with reference to FIGS. 1, 2 and 5 to 14.

Figure 6:
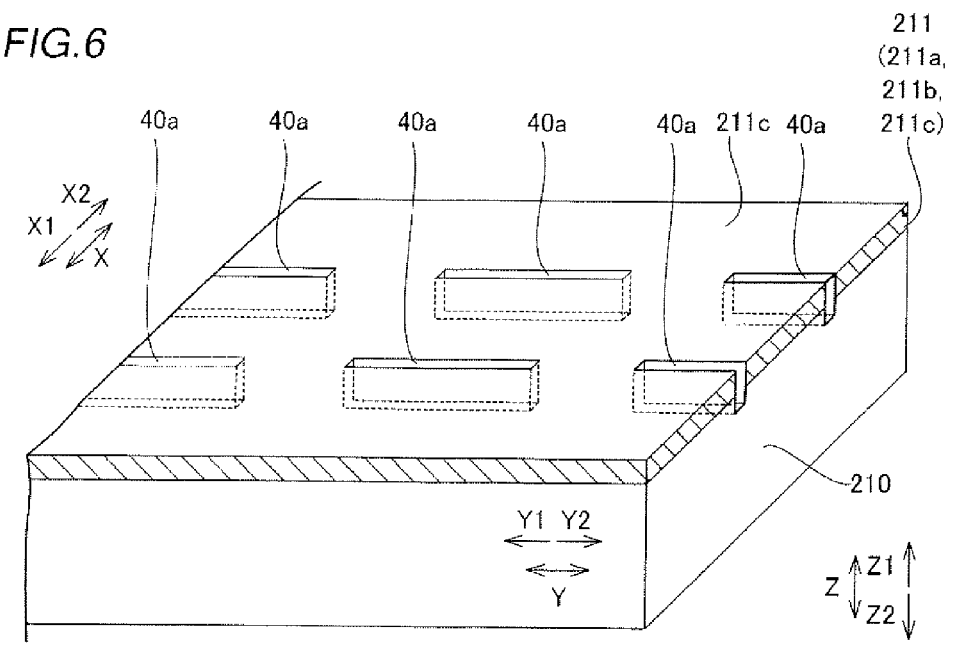
FIGS. 6 to 14 are diagrams for illustrating a process of manufacturing the semiconductor laser device according to the first embodiment shown in FIG. 1.

As shown in FIG. 6, a blue-violet semiconductor laser device portion 211 is formed by successively stacking an n-type cladding layer 211a, an active layer 211b, a p-type cladding layer 211c on an upper surface of a wafer-state n-type GaN substrate 210 by low-pressure MOCVD. The n-type GaN substrate 210 and a blue-violet semiconductor laser device portion 211 are examples of the "first substrate" and the "first semiconductor device layer" in the present invention, respectively. The "first semiconductor laser device substrate" in the present invention is constituted by the n-type GaN substrate 210 and the blue-violet semiconductor laser device portion 211.

In the process of manufacturing the semiconductor laser device 100 of the first embodiment, the first cleavage guide grooves 40a having a depth of about 5 µm in the direction Z2 are formed to extend from the p-type cladding layer 211c side (blue-violet semiconductor laser device portion 211 side) of the blue-violet semiconductor laser device portion 211 in the direction Y by photolithography and etching. The first cleavage guide grooves 40a extend perpendicular to the ridges 11d as viewed from the Z1 side and have substantially rectangular shapes. The first cleavage guide grooves 40a are formed to have substantially rectangular shapes, whereby no complex shaped mask may be required and hence the first cleavage guide grooves 40a can be easily formed. At this time, the first cleavage guide grooves 40a are formed in the form of broken lines to exclude regions (see FIG. 7) formed with the ridges 11d of the blue-violet semiconductor laser device portion 211 of the semiconductor laser device 100 and regions in the vicinity thereof, and are formed to reach not only the blue-violet semiconductor laser device portion 211 but an upper portion of the wafer-state n-type GaN substrate 210. Thus, the n-type GaN substrate 210 employed as a nitride-based semiconductor which is generally difficult to be cleaved and the blue-violet semiconductor laser device portion 211 can be more reliably cleaved. The first cleavage guide grooves 40a is an example of the "first groove" in the present invention.

Figure 7:
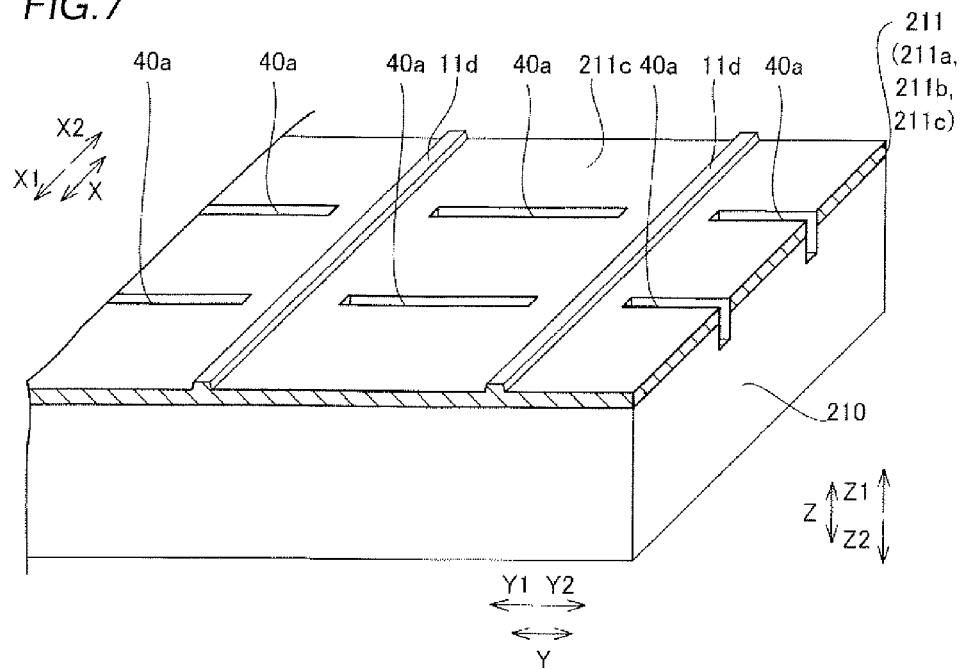

As shown in FIG. 7, prescribed regions of the p-type cladding layer 211c are removed by photolithography and etching, thereby extending the ridges 11d in the direction X. At this time, the depth (about 5 µm) of the first cleavage guide grooves 40a is larger than a height of the ridges 11d, whereby the first cleavage guide grooves 40a remain on the blue-violet semiconductor laser device portion 211 also after forming the ridges 11d.

Figure 8:
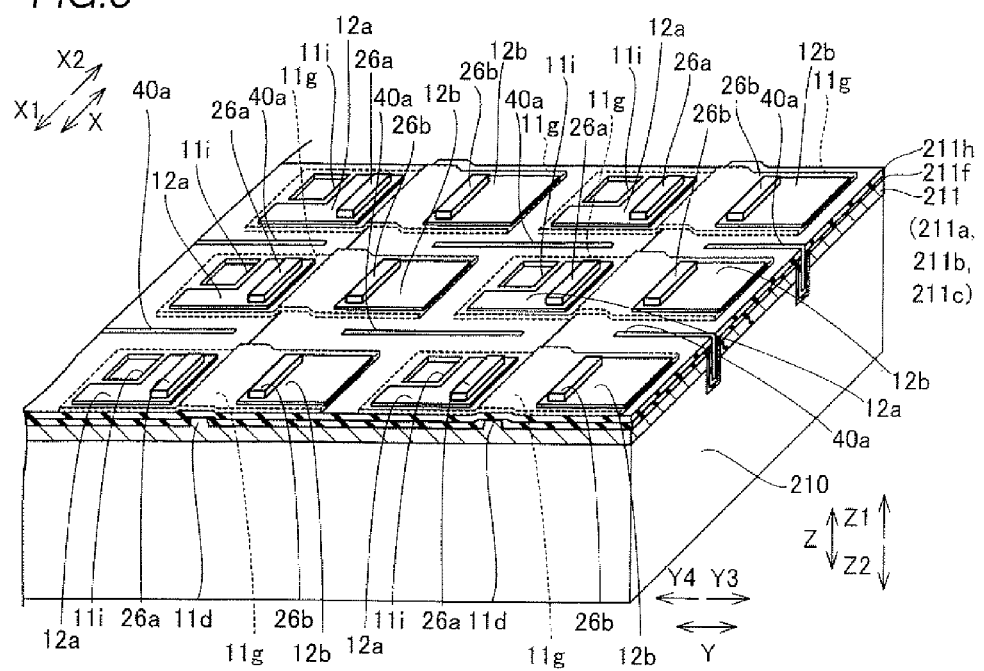

As shown in FIG. 8, a first insulating layer 211f is formed on the side surfaces of the ridges 11d of the p-type cladding layer 211c and upper surfaces of the planar portions by plasma CVD. At this time, the first insulating layer 211f is stacked also in the first cleavage guide grooves 40a. Then, after removing the first insulating layer 211f formed on the upper surfaces of the ridges 11d, a metal layer (not shown) is stacked on the upper surfaces of the ridges 11d and the upper surface of the first insulating layer 211f to correspond to the shape of the n-type GaN substrate 10 of the semiconductor laser device 100 worked into a chip by vacuum evaporation. Then, the metal layer is alloyed by thermal treatment of about 400° C. to form the p-side electrodes 11g at regular intervals.

A second insulating layer 211h is formed on upper surfaces of a plurality of p-side electrodes 11g and the upper surface of the first insulating layer 211f by plasma CVD. At this time, the second insulating layer 211h is stacked also on the upper surface of the first insulating layer 211f in the first cleavage guide grooves 40a. Thereafter, prescribed regions of the second insulating layer 211h are removed by photolithography and etching, thereby forming the wire bonding portions 11i formed by partially exposing the plurality of p-side electrode 11g.

In order to allow wire-bonding, the pad electrodes 12a and 12b are formed on the upper surfaces of the prescribed regions of the second insulating layer 211h to correspond to the shape of the n-type GaN substrate 10 of the semiconductor laser device 100 worked into a chip by photolithography and vacuum evaporation. Then, the fusion layers 26a and 26b are formed on the upper surfaces of the pad electrodes 12a and 12b, respectively.

Figure 9:
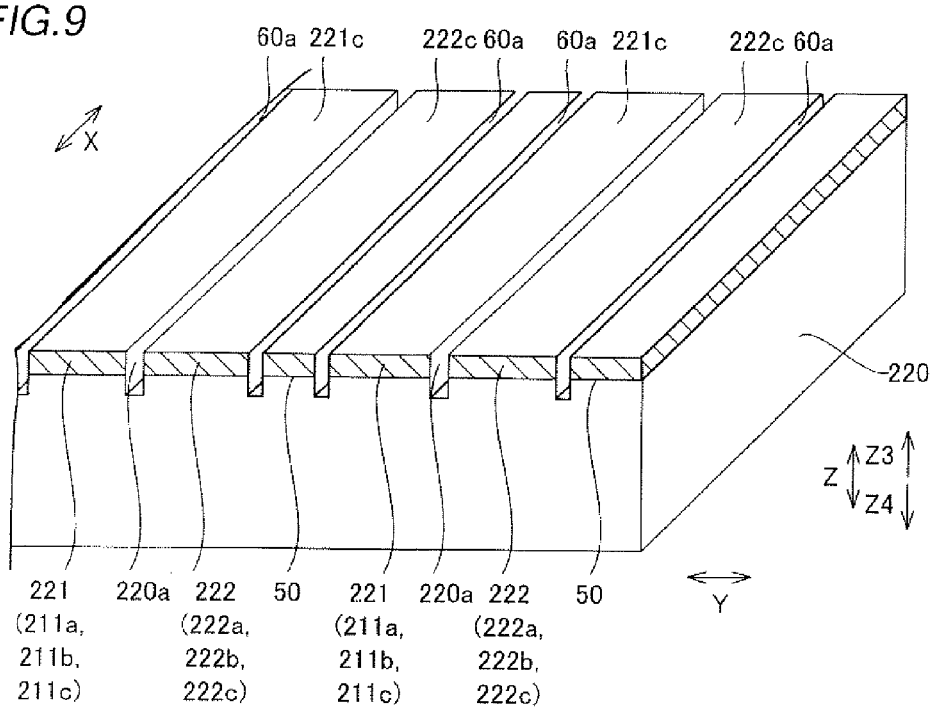

As shown in FIG. 9, an n-type cladding layer 222a, an active layer 222b, and a p-type cladding layer 222c are successively stacked on prescribed regions of an upper surface of a wafer-state n-type GaAs substrate 220 by photolithography and low-pressure MOCVD, thereby forming infrared semiconductor laser device portions 222. Thereafter, an n-type cladding layer 221a, an active layer 221b and a p-type cladding layer 221c are successively stacked on regions, formed with no infrared semiconductor laser device portions 222, of the upper surface of the wafer-state n-type GaAs substrate 220 so as not to be in contact with the infrared semiconductor laser device portions 222, thereby forming red semiconductor laser device portions 221. At this time, a plurality of grooves 220a are formed between the red and infrared semiconductor laser device portions 221 and 222, and removed portions 50 which are portions constituting the semiconductor laser device 100 worked into chips are also simultaneously formed. The n-type GaAs substrate 220 is an example of the "first substrate" in the present invention, and the red and infrared semiconductor laser device portions 221 and 222 are each an "second semiconductor device layer" in the present invention. The "second semiconductor laser device substrate" of the present invention is constituted by the n-type GaAs substrate 220 and the red and infrared semiconductor laser device portions 221 and 222. The removed portion 50 is an example of the "needless region" in the present invention.

The device division grooves 60a extending in the direction X are formed from the p-type cladding layers 211c and 222c sides of the red and infrared semiconductor laser device portions 221 and 222 by photolithography and etching. At this time, the device division grooves 60a are formed to reach not only the red and infrared semiconductor laser device portions 221 and 222 but an upper portion of the wafer-state n-type GaAs substrate 220, and to have substantially the same depth of the plurality of grooves 220a. The device division groove 60a is an example of the "third device division groove" in the present invention.

Figure 10:
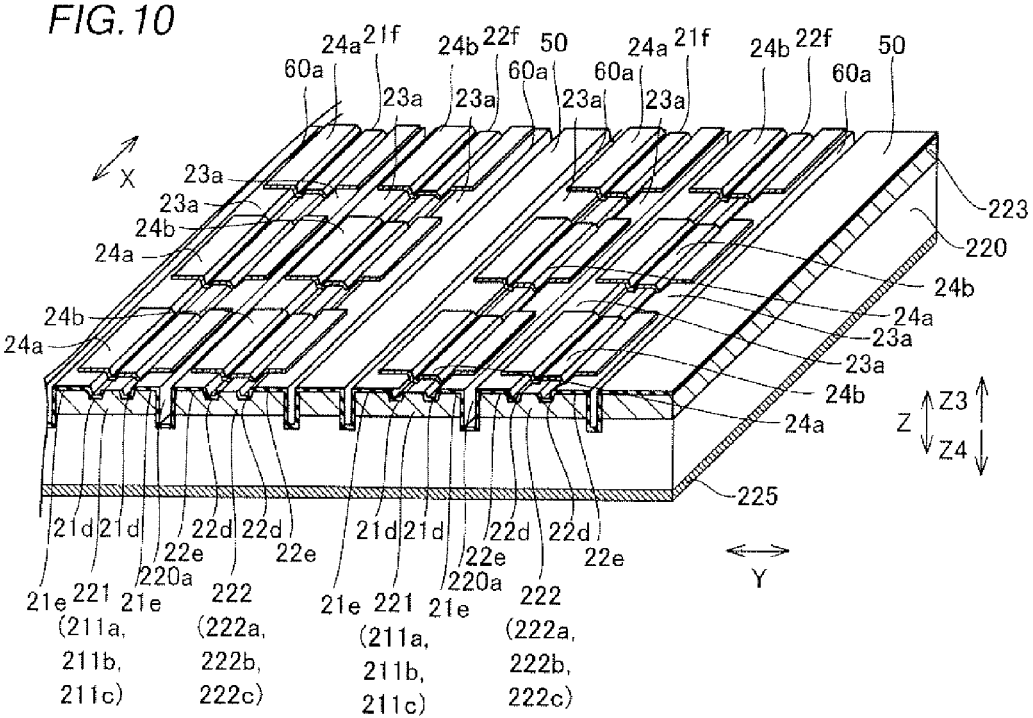

As shown in FIG. 10, prescribed regions of the p-type cladding layer 211c are removed by photolithography and etching, thereby extending the ridges 21d in the direction X, while prescribed regions of the p-type cladding layer 222c are removed, thereby extending the ridges 22f in the direction X. When the ridges 21f and 22f are formed, the prescribed regions of the p-type cladding layers 221c and 222c are simultaneously removed, whereby the recess portions 21d and 22d formed on the both sides of the ridges 21f and 22f are formed, and the planar portions 21e and 22e extending to the both sides of the recess portions 21d and 22d are formed.

An insulating layer 223 having a uniform thickness is formed on the upper surfaces of the p-type cladding layers 221c and 222c and the upper surface of the wafer-state n-type GaAs substrate 220 by plasma CVD. At this time, the insulating layer 223 are stacked also in the grooves 220a and the device division grooves 60a and the planar portions 23a are formed on the upper surfaces of the planar portions 21e and 22e. The insulating layer 223 formed on the upper surfaces of the ridges 21f and 22f are removed by photolithography and etching. Thus, the plurality of planar portions 23a are located above (in a direction Z3) the upper surfaces of the ridges 21f and 22f.

A metal layer (not shown) is stacked on the upper surfaces of the plurality of ridges 21f and 22f and the upper surfaces of the prescribed regions of the insulating layer 223 to correspond to the shapes of the n-type GaAs substrates 20 of the semiconductor laser devices 100 worked into chips by photolithography and vacuum evaporation.

A thickness of the wafer-state n-type GaAs substrate 220 is reduced from a side (Z4 side) opposite to the side formed with the red and infrared semiconductor laser device portions 221 and 222 by etching, so that the wafer-state n-type GaAs substrate 220 has a thickness of about 100 μm.

A metal layer (not shown) is stacked on a surface on the side (Z4 side), opposite to the side formed with the red and infrared semiconductor laser device portions 221 and 222, of the wafer-state n-type GaAs substrate 220 by vacuum evaporation. Then, thermal treatment is performed at a temperature of about 400° C. Thus, the metal layer on the upper surfaces of the plurality of ridges 21f and 22f are alloyed to form the p-side electrodes 24a and 24b, and the metal layer on the surface of the wafer-state n-type GaAs substrate 220 on the Z4 side is alloyed to form an n-side electrode 225. Thus, the plurality of ridges 21f and the p-side electrodes 24a can be brought into ohmic contact with each other, and the plurality of ridges 22f and the p-side electrodes 24b can be brought into ohmic contact with each other. Further, the wafer-state n-type GaAs substrate 220 and the n-side electrode 225 can be brought into ohmic contact with each other.

Figure 11:
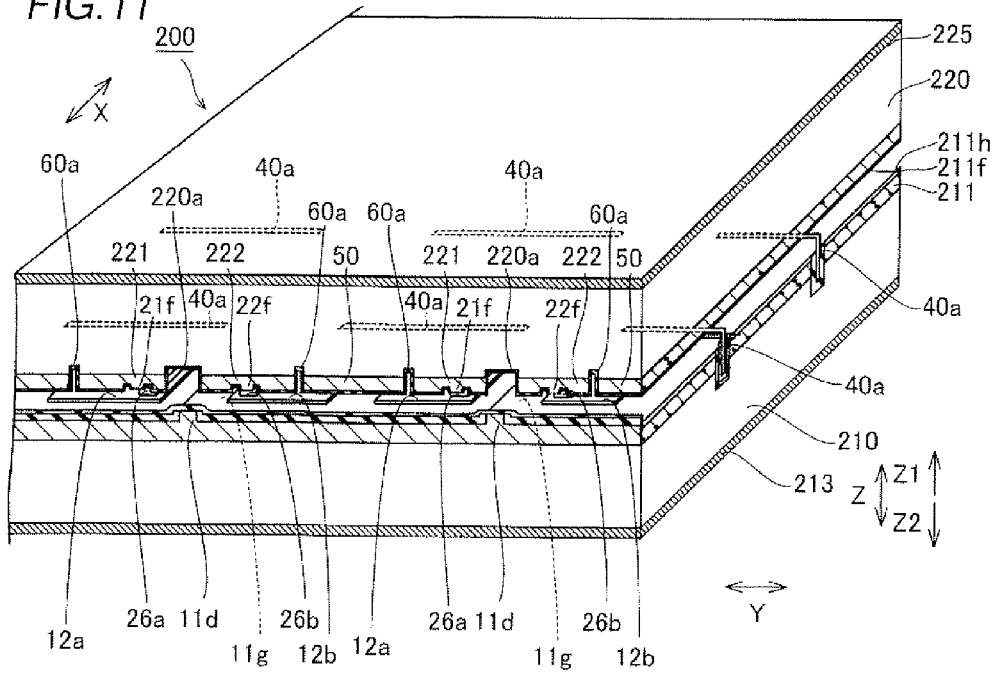

In the manufacturing process according to the first embodiment, the plurality of fusion layers 26a and 26b formed on the surface of the wafer-state n-type GaN substrate 210 and the plurality of p-side electrodes 24a and 24b formed on the surface of the wafer-state n-type GaAs substrate 220 are bonded to each other, as shown in FIG. 11. At this time, the plurality of fusion layers 26a and 26b are melt by applying heat having at least about 200° C. and not more than about 350° C., and the plurality of pad electrodes 12a and 12b formed on the surface of the wafer-state n-type GaN substrate 210 and the plurality of p-side electrodes 24a and 24b are bonded to each other. At this time, the plurality of pad electrodes 12a and 12b and the plurality of p-side electrodes 24a and 24b are so bonded to each other that the device division grooves 60a are located on the plurality of pad electrodes 12a and 12b. A lower surface (surface on the Z2 side) of the wafer-state n-type GaN substrate 210 is polished, whereby the wafer-state n-type GaN substrate 210 has a thickness of about 100 μm. Thereafter, an n-side electrode 213 is formed on the lower surface of the wafer-state n-type GaN substrate 210 by vacuum evaporation. At this time, thermal treatment for forming the n-side electrode 213 is not performed. Thus, the wafer-state semiconductor laser device 200 is formed.

Figure 12:
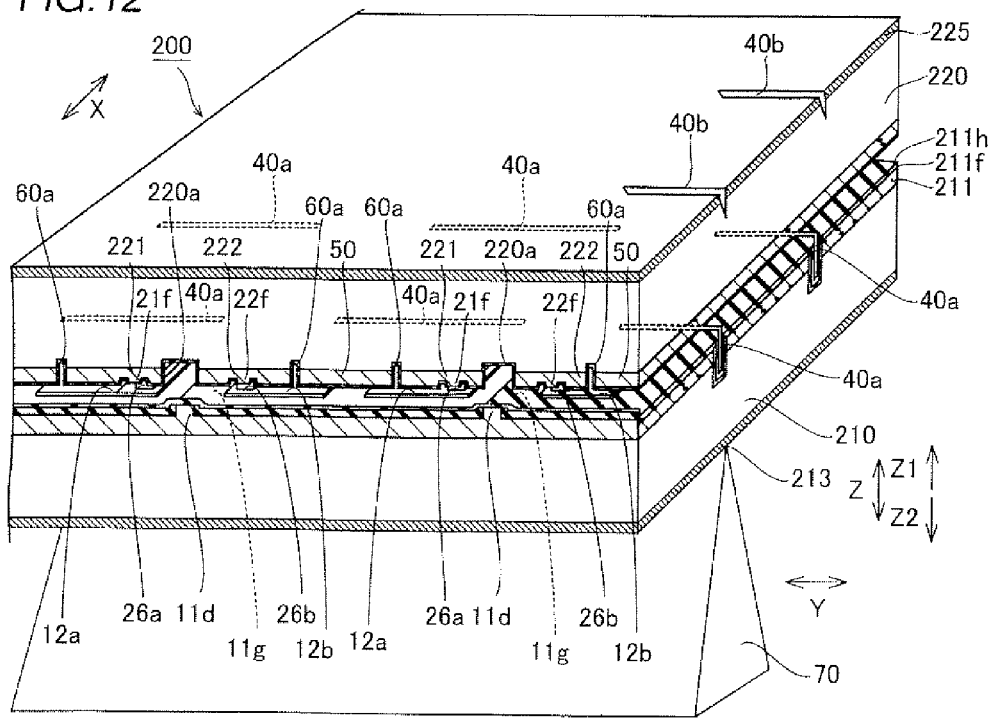

In the manufacturing process of the first embodiment, second cleavage guide grooves 40b are formed on Y-side both ends of a surface, formed with the n-side electrode 225 of the wafer-state n-type GaAs substrate 220 with a diamond point, as shown in FIG. 12. At this time, the second cleavage guide grooves 40b overlap on a surface (YZ plane) perpendicular to the wafer-state n-type GaN substrates 210 and the wafer-state n-type GaAs substrate 220 to correspond to the first cleavage guide grooves 40a formed on the wafer-state n-type GaN substrate 210, and formed only on the both ends of the wafer-state n-type GaAs substrate 220 on the Y sides. In other words, the second cleavage guide grooves 40b are not formed on a region other than the both ends of the wafer-state n-type GaAs substrate 220 on the Y sides. The second cleavage guide groove 40b is an example of the "second groove" in the present invention.

Figure 13:
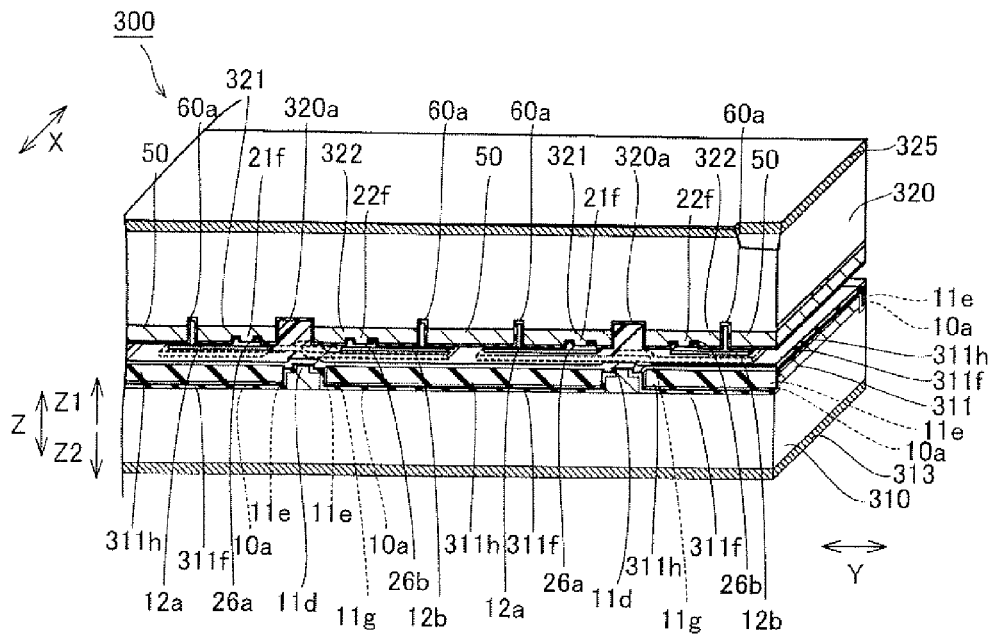

In this state, an edged tool 70 is pressed from the lower surface (surface on the Z2 side) side of the wafer-state n-type GaN substrate 210, thereby cleaving the wafer-state semiconductor laser device 200. Thus, the bar-shaped semiconductor laser device 300 is formed, and the pairs of cavity facets 11j, 21g and 22g (see FIG. 5) are formed on both ends of blue-violet, red and infrared semiconductor laser device portions 311, 321 and 322 on the X sides, respectively, as shown in FIG. 13. The first cleavage guide grooves 40a partially remain on the both ends of a bar-shaped n-type GaN substrate 310 and the blue-violet semiconductor laser device portion 311 on the X sides, thereby forming step portions 10a and 11e. At this time, the step portions 10a and 11e are formed on the n-type GaN substrate 10 and the blue-violet semiconductor laser device portion 11 to extend between the n-type GaN substrate 10 (blue-violet semiconductor laser 11) and the red or infrared semiconductor laser device portion 21 or 22, respectively. The dielectric film 31 and dielectric multiplayer films 32 (see FIG. 5) are formed on cleavage planes located on both ends of the bar-shaped semiconductor laser device 300 on the X sides by facet coating treatment in the manufacturing process.

Figure 14:
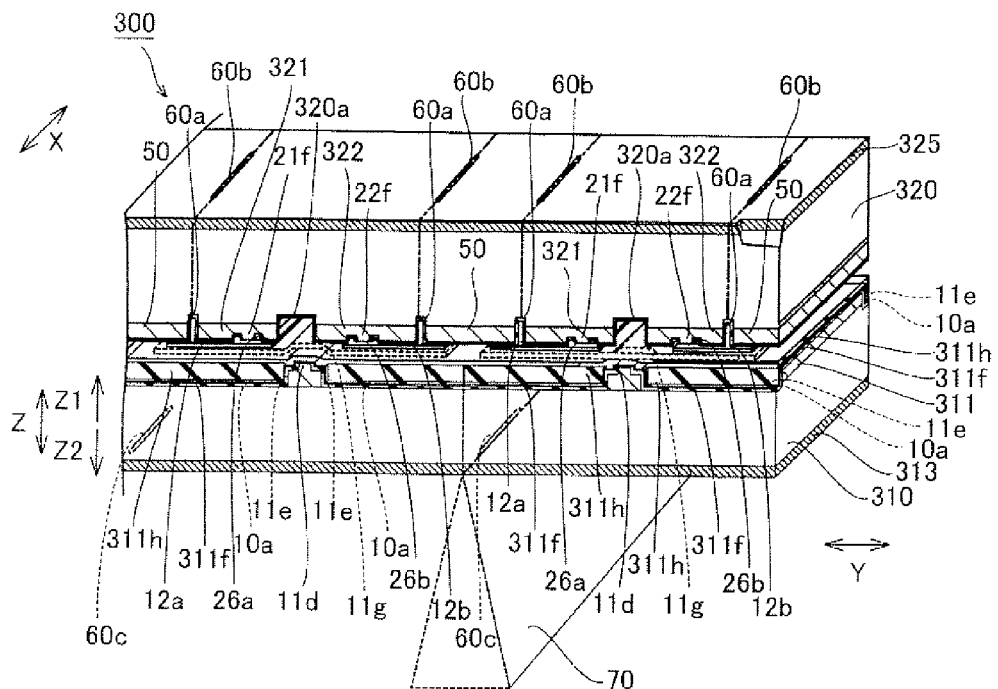

As shown in FIG. 14, the device division grooves 60b are formed on an n-side electrode 325 side of a bar-shaped n-type GaAs substrate 320 to extend in the direction X with the diamond point, and the device division grooves 60c are formed on an n-side electrode 313 side of the bar-shaped n-type GaN substrate 310 to extend in the direction X. At this time, the two device division grooves 60b are formed on the two-wavelength semiconductor laser device portion 30 with respect to the one device division groove 60c. The region including no red and infrared semiconductor laser device portions 321 and 322, held between the two device division grooves 60b is the removed portion 50 of the two-wavelength semiconductor laser device portion 30 removed in device division (division into chips) described later. The device division grooves 60b is an example of the "second device division groove" in the present invention.

In this state, the edged tool 70 is pressed from a side (Z2 side) formed with the n-side electrode 313 of the blue-violet semiconductor laser device portion 311 of the bar-shaped n-type GaN substrate 310, thereby dividing the bar-shaped semiconductor laser device 300. At this time, the removed portions 50 which are portions not bonded by the fusion layers 26a and 26b are simultaneously removed. Thus, the wire bonding portion 11i (see FIG. 8) of the blue-violet semiconductor laser device portion 11 is exposed outside. The device division grooves 60c partially remain on the both ends of the n-type GaN substrate 10 and the blue-violet semiconductor laser device portion 11 on the Y sides, thereby forming the step portions 10b and 13a (see FIG. 1), while the device division grooves 60b partially remain on the both ends of the n-type GaAs substrate 20 and the n-side electrode 25 on the Y sides, thereby forming the step portions 20b and 25a (see FIG. 1). Thus, the semiconductor laser device 100 (see FIG. 1) according to the first embodiment is formed.

In the manufacturing process of the semiconductor laser device according to the first embodiment, as hereinabove described, after the step of bonding the red and infrared semiconductor laser device portions 221 and 222 onto the blue-violet semiconductor laser device portion 211 formed with the first cleavage guide grooves 40a, cleavage is performed along the first and second cleavage guide grooves 40a and 40b in order to form cleavage planes on the blue-violet semiconductor laser device portion 211 and the wafer-state n-type GaN substrate 210 as well as the red and infrared semiconductor laser device portions 221 and 222 and the wafer-state n-type GaAs substrate 220, whereby the blue-violet semiconductor laser device portion 211 and the red and infrared semiconductor laser device portions 221 and 222 are simultaneously cleaved in a state where the red and infrared semiconductor laser device portions 221 and 222 are bonded onto the blue-violet semiconductor laser device portion 211, and hence the cavity facets 11j, 21g and 22g consisting of the cleavage planes can be simultaneously formed on the blue-violet, red and infrared semiconductor laser device portions 211, 221 and 222, respectively. Thus, the cavity facets, 11j, 21g and 22g of the blue-violet, red and infrared semiconductor laser device portions 211, 221 and 222 can be easily located on the same surface.

In the manufacturing process of the semiconductor laser device according to the first embodiment, the blue-violet semiconductor laser device portion 211 provided with the first cleavage guide grooves 40a is bonded onto the red and infrared semiconductor laser device portions 221 and 222, whereby the blue-violet semiconductor laser device portion 211 side which is the side provided with the first cleavage guide grooves 40a may not be pressed to be cleaved and hence the excellent plurality of cavity facets 11j can be formed on the blue-violet semiconductor laser device portion 211, and the red and infrared semiconductor laser device portions 221 and 222 can be located on the blue-violet semiconductor laser device portions 211 and hence the light-emitting points of the blue-violet semiconductor laser device portion 211 and the light-emitting points of the red and infrared semiconductor laser device portions 221 and 222 can be brought close to each other. The first cleavage guide grooves 40a can allow easy cleavage also when the blue-violet semiconductor laser device portion 211 and the wafer-state n-type GaN substrate 210 have large thicknesses. Further, the blue-violet semiconductor laser device portion 211 and the wafer-state n-type GaN substrate 210 as well as the red and infrared semiconductor laser device portions 221 and 222 and the wafer-state n-type GaAs substrate 220 can be cleaved along the first and second cleavage guide grooves 40a and 40b, and hence the wafer-state semiconductor laser device 200 can be more reliably cleaved as compared with a case where only the first cleavage guide grooves 40a are formed. Thus, the more excellent cavity facets 21g and 22g can be obtained not only on the blue-violet semiconductor laser device portion 211 also on the red and infrared semiconductor laser device portions 221 and 222.

In the manufacturing process of the semiconductor laser device according to the first embodiment, the first cleavage guide grooves 40a are formed in the form of the broken lines on the region except the plurality of ridges 11d of the blue-violet semiconductor laser device portion 211 and the vicinity thereof in the step of forming the first cleavage guide grooves 40a in the blue-violet semiconductor laser device portion 211, whereby the first cleavage guide grooves 40a are formed on positions separated from the regions of the plurality of ridges 11d, which are light-emitting portions, of the blue-violet semiconductor laser device portion 211, and the vicinity thereof, and hence the ridges 11d of the blue-violet semiconductor laser device portion 211 can be inhibited from being damaged also when the first cleavage guide grooves 40a are formed. The first cleavage guide grooves 40a can be formed to extend on an substantially overall area, except the plurality of ridges 11d of the blue-violet semiconductor laser device portion 211 and the vicinity thereof, and hence the wafer-state n-type GaN substrate 210 and the blue-violet semiconductor laser device portion 211 can be reliably cleaved.

In the manufacturing process of the semiconductor laser device according to the first embodiment, the first cleavage guide grooves 40a are formed in a width direction (direction Y) of the device substantially perpendicular to an extensional direction (direction X) of the plurality of ridges 11d in the step of forming the first cleavage guide grooves 40a on the blue-violet semiconductor laser device portion 211, whereby the blue-violet semiconductor laser device portion 211 and the red and infrared semiconductor laser device portions 221 and 222 are cleaved along the direction Y (width direction of the device) substantially perpendicular to the extensional direction of the ridges 11d by the first cleavage guide grooves 40a, and hence the cavity facets 11j, 21g and 22g (see FIG. 5) consisting of the cleavage planes substantially perpendicular to the ridges 11d (waveguides) can be easily formed.

In the manufacturing process of the semiconductor laser device according to the first embodiment, the first cleavage guide grooves 40a are formed to have the depth reaching not only the blue-violet semiconductor laser device portion 211 but the upper portion of the wafer-state n-type GaN substrate 210, whereby the thickness of the n-type GaN substrate 210 formed with no the first cleavage guide grooves 40a is further reduced (thinner) due to the first cleavage guide grooves 40a having the depth reaching the n-type GaN substrate 210 also when the wafer-state semiconductor laser device 200 is formed by the n-type GaN substrate 210 which is generally difficult to be cleaved, and hence the n-type GaN substrate 210 made of nitride-based semiconductor can be more easily cleaved.

In the manufacturing process of the semiconductor laser device according to the first embodiment, the wafer-state blue-violet, red and infrared semiconductor laser device portion 211, 221 and 222 are simultaneously cleaved along the first and second cleavage guide grooves 40a and 40b in a state where the second cleavage guide grooves 40b are formed on positions, overlapped with the regions formed with the first cleavage guide grooves in plan view, of the n-type GaAs substrate 220 in step of forming the second cleavage guide grooves 40b on the wafer-state n-type GaAs substrate 220, whereby the bonded wafers can be more reliably cleaved as compared with a case of cleaving only along the first cleavage guide grooves 40a. Thus, more excellent cavity facets (cleavage planes) can be obtained not only on the blue-violet semiconductor laser device portion 211 but also on the red and infrared semiconductor laser device portions 221 and 222.

In the manufacturing process of the semiconductor laser device according to the first embodiment, the second cleavage guide grooves 40b are formed on the surface on the side opposite to the side bonded onto the blue-violet semiconductor laser device portion 211 (on the Z1 side shown in FIG. 12) to correspond to the first cleavage guide grooves 40a in the step of forming the second cleavage guide grooves 40b on the wafer-state n-type GaAs substrate 220, whereby positions of the second cleavage guide grooves 40b can be easily recognized from outside, and hence pressing force for simultaneously cleaving the wafer-state blue-violet, red and infrared semiconductor laser device portions 211, 221 and 222 with the edged tool 70 can be suitably applied while confirming the positions of the second cleavage guide grooves 40b.

In the manufacturing process of the semiconductor laser device according to the first embodiment, the second cleavage guide grooves 40b are formed in the vicinity of the Y-side both ends of the surface, on the side opposite to the side formed with the red and infrared semiconductor laser device portions 221 and 222, of the wafer-state n-type GaAs substrate 220 in the step of forming the second cleavage guide grooves 40b on the wafer-state n-type GaAs substrate 220, whereby the wafer-state n-type GaAs substrate 220 and the red and infrared semiconductor laser device portions 221 and 222 can be easily cleaved, and the cavity facets 11j, 21g, and 22g of the blue-violet, red and infrared semiconductor laser device portions 211, 221 and 222 can be inhibited from being deviated in a cavity direction (direction X) due to deviation of the first and second cleavage guide grooves 40a and 40b when the second cleavage guide grooves 40b are formed on an overall area of the wafer-state n-type GaAs substrate 220.

In the manufacturing process of the semiconductor laser device according to the first embodiment, the partial wafer (removed portions 50 of the two-wavelength semiconductor device portion 30 shown in FIG. 14) on the bonded red and infrared semiconductor laser device portions 221 and 222 side is removed after the step of cleaving the wafer-state blue-violet, red and infrared semiconductor laser device portions 211, 221 and 222, whereby device division can be preformed only on the portion of the blue-violet semiconductor laser device portion 211 with no removed portions 50 along the cavity direction (direction X) when the wafer after removing the removed portions 50 is divided into chips in subsequent steps, and hence a chip of the semiconductor laser device 100 can be easily obtained.

In the manufacturing process of the semiconductor laser device according to the first embodiment, after the step of cleaving the wafer-state blue-violet, red and infrared semiconductor laser device portion 211, 221 and 222, protective films made of dielectric multilayer films are formed on the cleavage planes (cavity facets 11j, 21g and 22g) in advance of the step of removing the removed portions 50, whereby the wafer in which the blue-violet semiconductor laser device portion 211 and the red and infrared semiconductor laser device portions 221 and 222 are bonded to each other is formed with protective films (insulating films) on the cavity facets 11j, 21g and 22g (cleavage planes) in a state where the wafer has a substantially uniform thickness. Thus, a disadvantage that the exposed pad electrodes 12a and 12b are insulated by the protective films extending toward and covering the surfaces of the exposed pad electrodes 12a and 12b (see FIG. 5) does not occur dissimilarly to a case where the removed portions 50 are removed to expose the pad electrodes 12a and 12b on the blue-violet semiconductor laser device portion 211 before forming the protective films and the protective films are thereafter formed, for example, and hence the wires bonded after division into chips and the pad electrodes 12a and 12b can be reliably electrically connected (wire-bonded).

In the manufacturing process of the semiconductor laser device according to the first embodiment, when the wafer where the blue-violet semiconductor laser device portion 211 and the red and infrared semiconductor laser device portions 221 and 222 are bonded is divided into chips, the removed portions 50 are simultaneously removed, whereby the removed portions 50 are simultaneously removed when dividing the wafer into chips, and hence the manufacturing process can be simplified.

In the manufacturing process of the semiconductor laser device according to the first embodiment, the device division grooves 60c are formed on the surface of the bar-shaped n-type GaN substrate 310 in advance of the step of dividing the wafer into chips, and the device division grooves 60b for removing the removed portions 50 are formed on the surface of the bar-shaped n-type GaAs substrate 320, whereby the n-type GaAs substrate 320 can be also divided on the positions formed with the device division grooves 60b into regions remaining on the chips and regions removed from the chips (removed portions 50) in response to division of the n-type GaN substrate 310 on the portions of the device division grooves 60c when dividing the bar. Thus, the removed portions 50 can be easily removed while the wafer is simultaneously divided into chips.

In the manufacturing process of the semiconductor laser device according to the first embodiment, the device division grooves 60a are formed on the surface on the side opposite to the side formed with the device division grooves 60b to correspond to the device division grooves 60b in advance of bonding the red semiconductor laser device portions 221 (infrared semiconductor laser device portions 222) onto the wafer-state blue-violet semiconductor laser device portion 211, whereby in the bar-shaped n-type GaAs substrate 320, the wafer (substrate) is easily partially divided not only by the device division grooves 60b but the device division grooves 60a, and hence the removed portions 50 can be easily removed.

In the manufacturing process of the semiconductor laser device according to the first embodiment, the pad electrodes 12a and 12b are exposed by removing the removed portions 50, whereby the wires can be easily bonded onto the portions of the pad electrodes 12a and 12b exposed on the surface of the bar-shaped blue-violet semiconductor laser device portion 211 by removing the removed portions 50.

Modification of First Embodiment

A modification of the first embodiment will be described with reference to FIGS. 15 to 17. In this modification of the first embodiment, second cleavage guide grooves 40c formed on an n-side electrode 225 side of an n-type GaAs substrate 220 are formed in the form of broken lines along a direction Y, dissimilarly to the aforementioned manufacturing process of the first embodiment.

Figure 15:
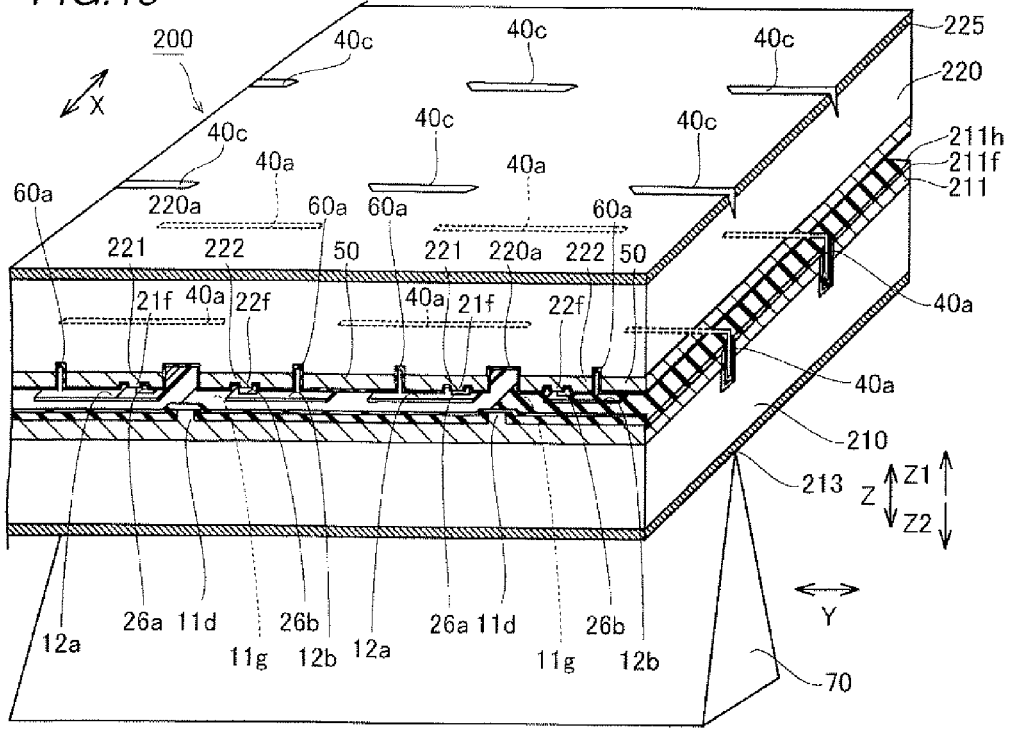
FIGS. 15 to 17 are diagrams for illustrating a process of manufacturing a semiconductor laser device according to a modification of the first embodiment of the present invention.

In other words, in the manufacturing process in the modification of the first embodiment, the broken-line shaped second cleavage guide grooves 40c in which groove portions having a length of about 200 μm are formed at intervals of about 200 μm along the direction Y are formed on a surface, formed with the n-side electrode 225, of the wafer-state n-type GaAs substrate 220 with a diamond point, as shown in FIG. 15. At this time, the second cleavage guide grooves 40c are formed to overlap on a surface (YZ plane) perpendicular to the n-type GaN substrate 210 and the n-type GaAs substrate 220 to correspond to the first cleavage guide grooves 40a formed on the n-type GaN substrate 210.

Each of the broken-line shaped second cleavage guide grooves 40c is formed on a region corresponding to a removed portion 50 removed in later steps. The second cleavage guide groove 40c is an example of the "second groove" in the present invention.

Figure 16:
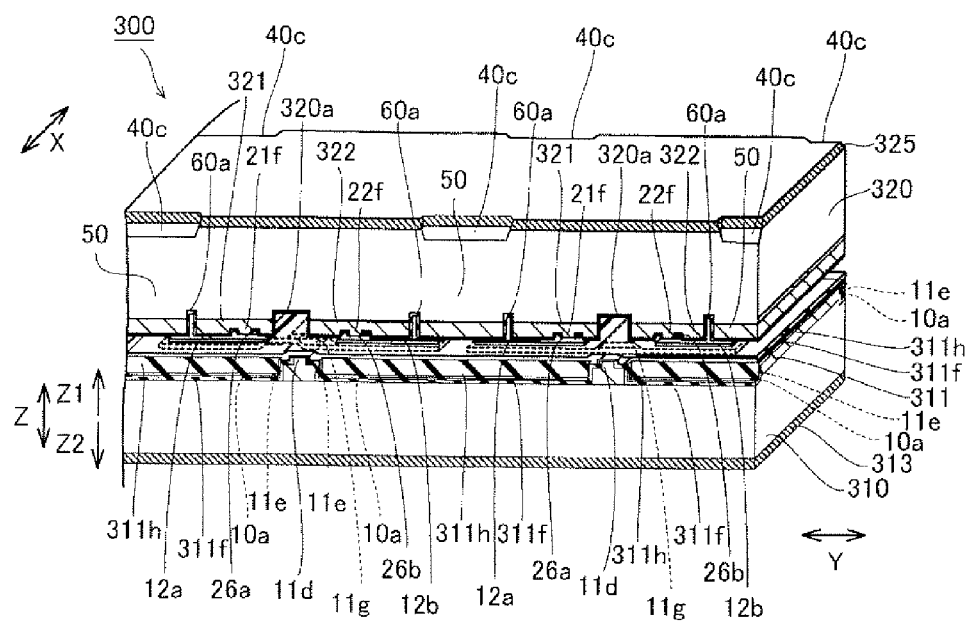

In this state, an edged tool 70 is pressed from a lower surface (surface on a Z2 side) side of the wafer-state n-type GaN substrate 210, thereby cleaving a wafer-state semiconductor laser device 200, as shown in FIG. 16. At this time, the wafer is cleaved along the broken-line shaped second cleavage guide grooves 40c.

Figure 17:
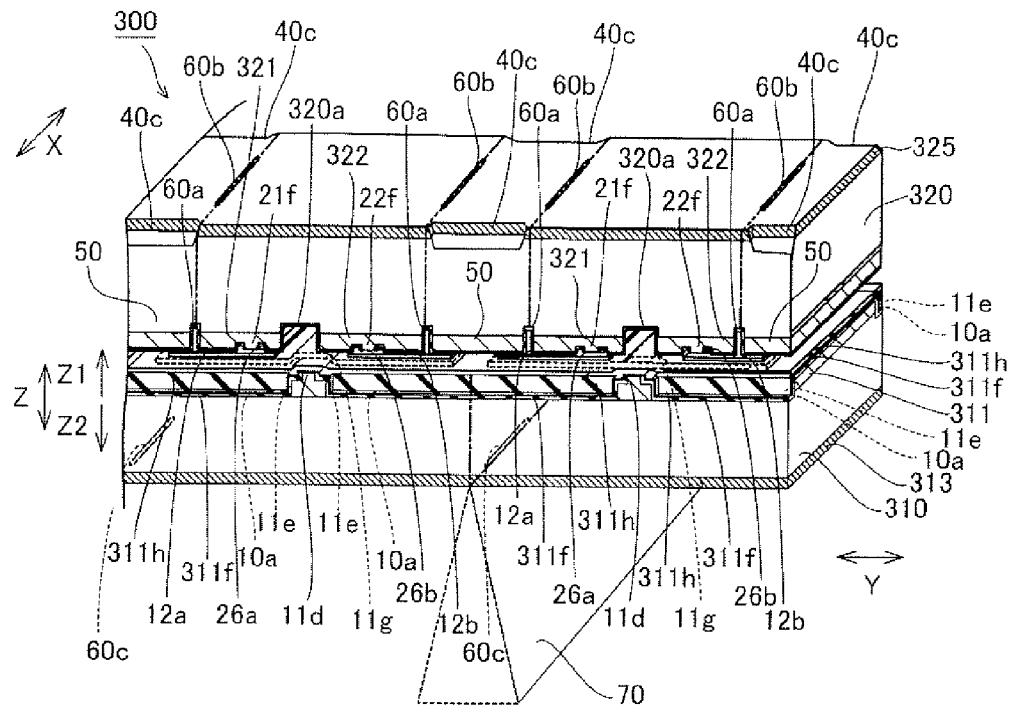

As shown in FIG. 17, device division grooves 60b are formed on an n-side electrode 325 side of a bar-shaped n-type GaAs substrate 320 to extend in a direction X and device division grooves 60c are formed on an n-side electrode 313 side of a bar-shaped n-type GaN substrate 310 to extend in the direction X, similarly to the aforementioned manufacturing process of the first embodiment.

In this state, the edged tool 70 is pressed from a side (Z2 side) formed with the n-side electrode 313 of a blue-violet semiconductor laser device portion 311 of the bar-shaped n-type GaN substrate 310, thereby dividing a bar-shaped semiconductor laser device 300. At this time, the removed portions 50 which are portions not bonded by fusion layers 26a and 26b are removed.

In the manufacturing process of the semiconductor laser device according to the modification of the first embodiment, as hereinabove described, the second cleavage guide grooves 40c are formed in the form of the broken lines along the direction Y in the step of forming the second cleavage guide grooves 40c on the wafer-state n-type GaAs substrate 220, whereby the second cleavage guide grooves 40c can be formed in the form of broken lines on a substantially overall area of the surface formed with the n-side electrode 225 of the wafer-state n-type GaAs substrate 220 along an extensional direction of the first cleavage guide grooves 40a. Therefore, regions formed with the second cleavage guide grooves 40c are increased and hence the n-type GaAs substrate 220 can be more easily cleaved.

In the manufacturing process of the semiconductor laser device according to the modification of the first embodiment, the second cleavage guide grooves 40c formed on the n-type GaAs substrate 220 are formed on positions corresponding to the removed portions 50 of the n-type GaAs substrate 220, whereby only cavity facets 21g and 22g consisting of cleavage planes employing ends of the broken-line shaped second cleavage guide grooves 40c removed together with the removed portions 50 as starting points of cracks can be easily formed on regions remaining on a chip of the n-type GaAs substrate 220, dissimilarly to a case where the second cleavage guide grooves 40c remain the regions remaining on the chip of the n-type GaAs substrate 220.

Second Embodiment

Figure 18:
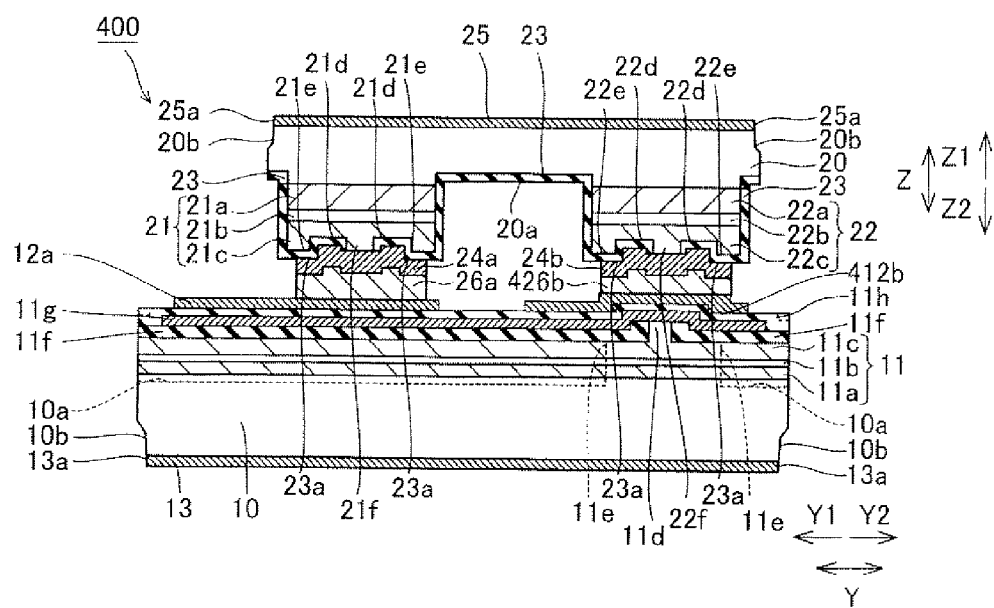
FIG. 18 is a diagram showing a structure of a semiconductor laser device formed by employing a manufacturing method according to a second embodiment of the present invention.

Referring to FIG. 18, in a second embodiment, an infrared semiconductor laser device portion 22 formed on an n-type GaAs substrate 20 is bonded onto an upper portion of a ridge 11d of a blue-violet semiconductor laser device portion 11 formed on an n-type GaN substrate 10 of a semiconductor laser device 400, dissimilarly to the aforementioned first embodiment.

In the semiconductor laser device 400 formed through a manufacturing method according to the second embodiment of the present invention, on an upper surface of a second insulating layer 11h, a pad electrode 412b is formed on a position corresponding to the upper portion of the ridge 11d of the blue-violet semiconductor laser device portion 11 provided on the n-type GaN substrate 10, as shown in FIG. 18. The infrared semiconductor laser device portion 22 provided on an n-type GaAs substrate 20 is bonded onto an upper surface of the pad electrode 412b through a fusion layer 426b. Thus, an interval between a light-emitting point of the blue-violet semiconductor laser device portion 11 and a light-emitting point of the infrared semiconductor laser device portion 22 can be reduced. The remaining structure, manufacturing process and effects of the semiconductor laser device 400 are similar to those of the aforementioned first embodiment.

Third Embodiment

Figure 19:
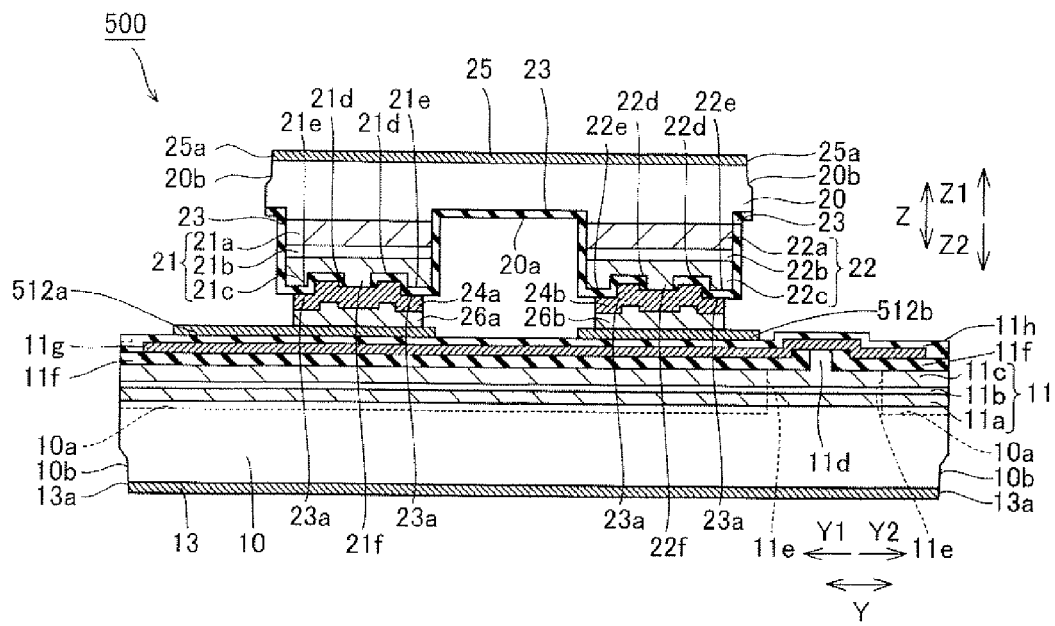
FIG. 19 is a diagram showing a structure of a semiconductor laser device formed by a manufacturing method according to a third embodiment of the present invention.

Referring to FIG. 19, in a third embodiment, an n-type GaAs substrate 20 is not located on an upper portion of a ridge 11d of a blue-violet semiconductor laser device portion 11 formed on an n-type GaN substrate 10 of a semiconductor laser device 500, dissimilarly to the aforementioned first embodiment.

In the semiconductor laser device 500 formed through a manufacturing method according to the third embodiment of the present invention, the ridge 11d of the blue-violet semiconductor laser device portion 11 provided on the n-type GaN substrate 10 is formed on a Y2 side, and pad electrodes 512a and 512b are so formed on an upper surface of a second insulating layer 11h on a Y1 side of the ridge 11d that the red and infrared semiconductor laser device portions 21 and 22 provided on the n-type GaAs substrate 20 can be bonded, respectively, as shown in FIG. 19. The red and infrared semiconductor laser device portions 21 and 22 provided on the n-type GaAs substrate 20 are bonded onto an upper surfaces of the pad electrodes 512a and 512b through fusion layers 26a and 26b, respectively. In other words, the n-type GaAs substrate 20 is formed not to be located on the upper portion of the ridge 11d of the blue-violet semiconductor laser device portion 11. Thus, heat can be easily radiated on the blue-violet semiconductor laser device portion 11. The remaining structure, manufacturing process and effects of the semiconductor laser device 500 are similar to those of the aforementioned first embodiment.

Fourth Embodiment

Figure 20:
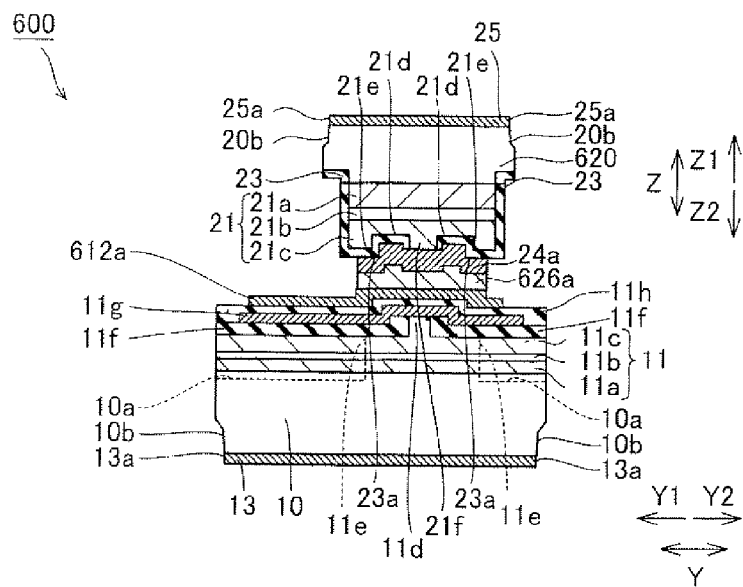
FIG. 20 is a diagram showing a structure of a semiconductor laser device formed by a manufacturing method according to a fourth embodiment of the present invention.

Referring to FIG. 20, in a fourth embodiment, a semiconductor laser device 600 is a two-wavelength semiconductor laser device in which a red semiconductor laser device portion 21 formed on an n-type GaAs substrate 620 is bonded onto an upper portion of a ridge 11d of a blue-violet semiconductor laser device portion 11 formed on an n-type GaN substrate 10, dissimilarly to the aforementioned second embodiment.

In the semiconductor laser device 600 formed through a manufacturing method of the fourth embodiment of the present invention, on an upper surface of a second insulating layer 11h, a pad electrode 612b is formed on a position corresponding to the upper portion of the ridge 11d of the blue-violet semiconductor laser device portion 11 provided on the n-type GaN substrate 10, as shown in FIG. 20. The red semiconductor laser device portion 21 provided on an n-type GaAs substrate 620 is bonded onto an upper surface of the pad electrode 612a through a fusion layer 626a. No infrared semiconductor laser device portion 22 in the second embodiment is formed on the n-type GaAs substrate 620. Thus, an interval between a light-emitting point of the blue-violet semiconductor laser device portion 11 and a light-emitting point of the infrared semiconductor laser device portion 22 can be reduced, and size of a chip of the semiconductor laser device 600 can be reduced. The remaining structure, manufacturing process and effects of the semiconductor laser device 600 are similar to those of the aforementioned second embodiment.

Fifth Embodiment

Figure 21:
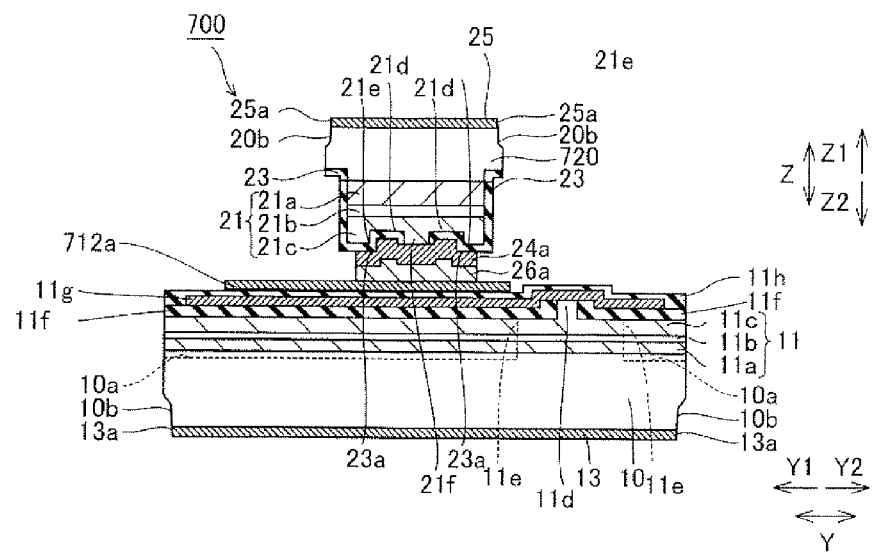
FIG. 21 is a diagram showing a structure of a semiconductor laser device formed by a manufacturing method according to a fifth embodiment of the present invention.

Referring to FIG. 21, in a fifth embodiment, a semiconductor laser device 700 is a two-wavelength semiconductor laser device in which an n-type GaAs substrate 720 and a red semiconductor laser device portion 21 are not located on an upper portion of a ridge 11d of a blue-violet semiconductor laser device portion 11 formed on an n-type GaN substrate 10, dissimilarly to the aforementioned third embodiment.

In the semiconductor laser device 700 formed through a manufacturing method of the fifth embodiment of the present invention, the ridge 11d of the blue-violet semiconductor laser device portion 11 provided on the n-type GaN substrate 10 is formed on a Y2 side, and a pad electrode 712a is so formed on an upper surface of a second insulating layer 11h on a Y1 side of the ridge 11d that the red semiconductor laser device portion 21 provided on the n-type GaAs substrate 720 can be bonded, as shown in FIG. 21. The red semiconductor laser device portion 21 provided on the n-type GaAs substrate 720 is bonded onto an upper surface of the pad electrode 712a through a fusion layer 26a. In other words, the n-type GaAs substrate 720 and the red semiconductor laser device portion 21 formed on the n-type GaAs substrate 720 are not located on the upper portion of the ridge 11d of the blue-violet semiconductor laser device portion 11. Thus, heat can be easily radiated on the blue-violet semiconductor laser device portion 11, and size of a chip of the semiconductor laser device 700 can be reduced. The remaining structure, manufacturing process and effects of the semiconductor laser device 700 are similar to those of the aforementioned third embodiment.

Sixth Embodiment

Figure 22:
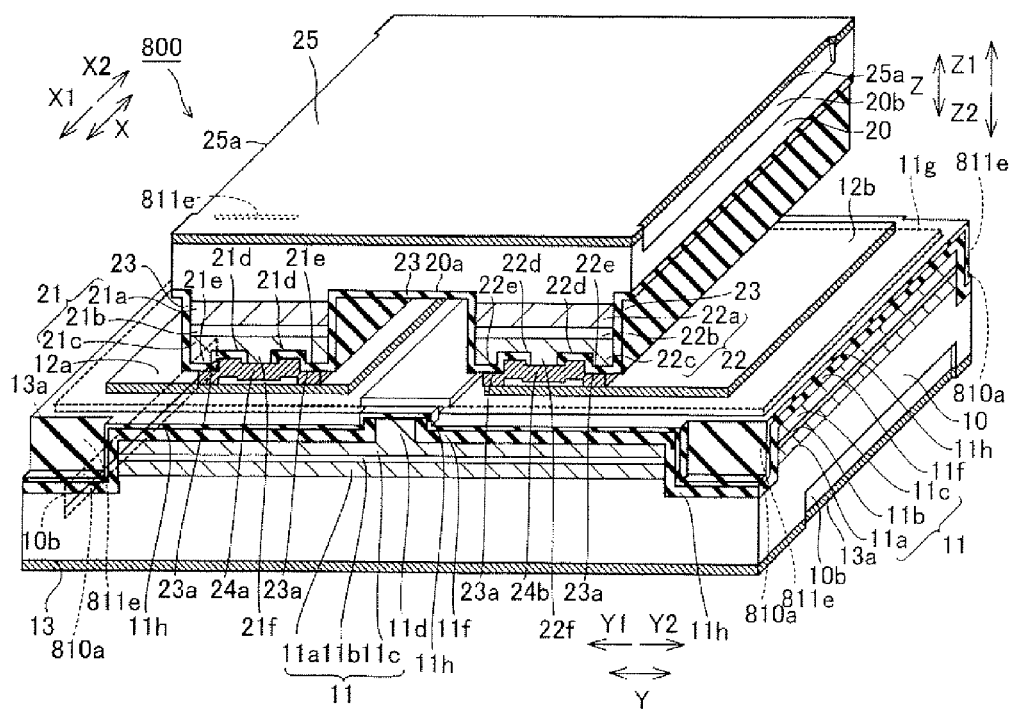
FIG. 22 is a perspective view showing a structure of a semiconductor laser device formed by a manufacturing method according to a sixth embodiment of the present invention.

Referring to FIG. 22, in a sixth embodiment, step portions 810a and 811e formed on an n-type GaN substrate 10 and a blue-violet semiconductor laser device portion 11 of a semiconductor laser device 800, respectively, are not located between the n-type GaN substrate 10 (blue-violet semiconductor laser 11) and a red or infrared semiconductor laser device portion 21 or 22, dissimilarly to the aforementioned first embodiment.

In the semiconductor laser device 800 formed through a manufacturing method of the sixth embodiment of the present invention, the n-type GaN substrate 10 and the blue-violet semiconductor laser device portion 11 are formed with the step portions 810a and 811e on both ends of the n-type GaAs substrate 10 and the blue-violet semiconductor laser device portion 11 on the X and Y sides, respectively, as shown in FIG. 22. In other words, the step portions 810a and 811e are formed on the n-type GaN substrate 10 and the blue-violet semiconductor laser device portion 11 so as not to be located between the n-type GaN substrate 10 (blue-violet semiconductor laser 11) and the red or infrared semiconductor laser device portion 21 or 22. Thus, in the manufacturing process, a wafer-state semiconductor laser device can be inhibited from accidentally cracking from first cleavage guide grooves. The remaining structure, manufacturing process and effects of the semiconductor laser device 800 are similar to those of the aforementioned first embodiment.

Seventh Embodiment

An optical pickup 900 according to a seventh embodiment of the present invention will be described with reference to FIG. 5 and FIGS. 23 to 25. The optical pickup 900 is an example of the "light apparatus" in the present invention.

Figure 23:
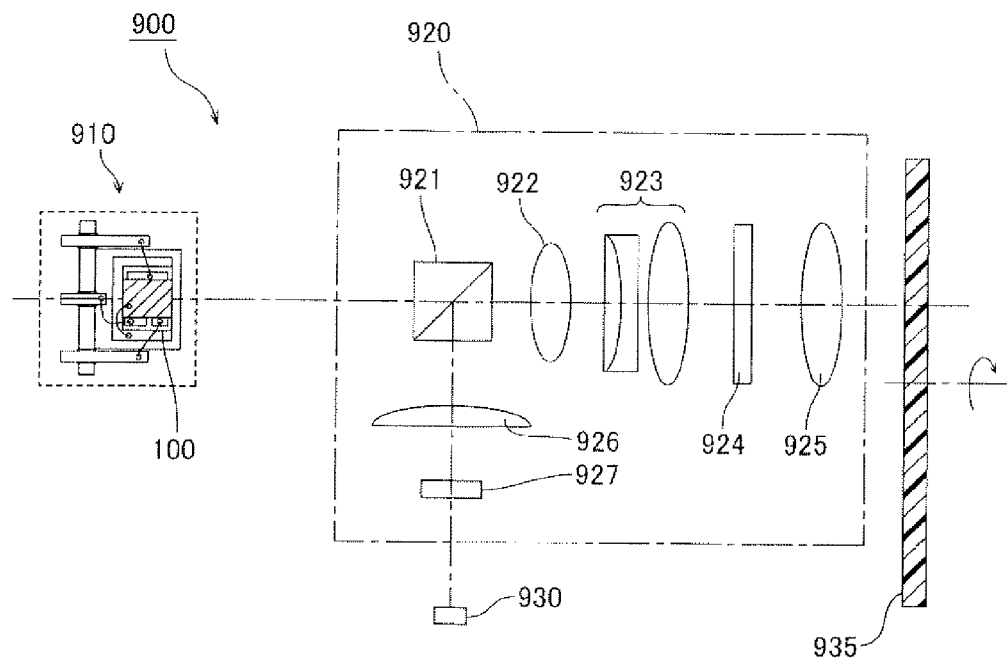
FIG. 23 is a block diagram of an optical pickup having a build-in semiconductor laser apparatus mounted with a semiconductor laser device according to a seventh embodiment of the present invention.

The optical pickup 900 according to the seventh embodiment of the present invention comprises a semiconductor laser apparatus 910 mounted with the semiconductor laser device 100 (see FIG. 25) according to the aforementioned first embodiment, an optical system 920 adjusting a laser beam emitted from the semiconductor laser apparatus 910, and a light detection portion 930 receiving the laser beam, as shown in FIG. 23.

Figure 24:
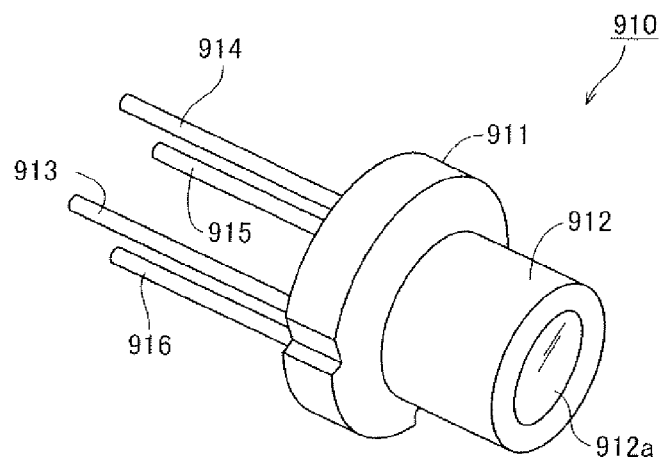
FIG. 24 is an external perspective view showing a schematic structure of the semiconductor laser apparatus mounted with the semiconductor laser device according to the seventh embodiment of the present invention.
Figure 25:
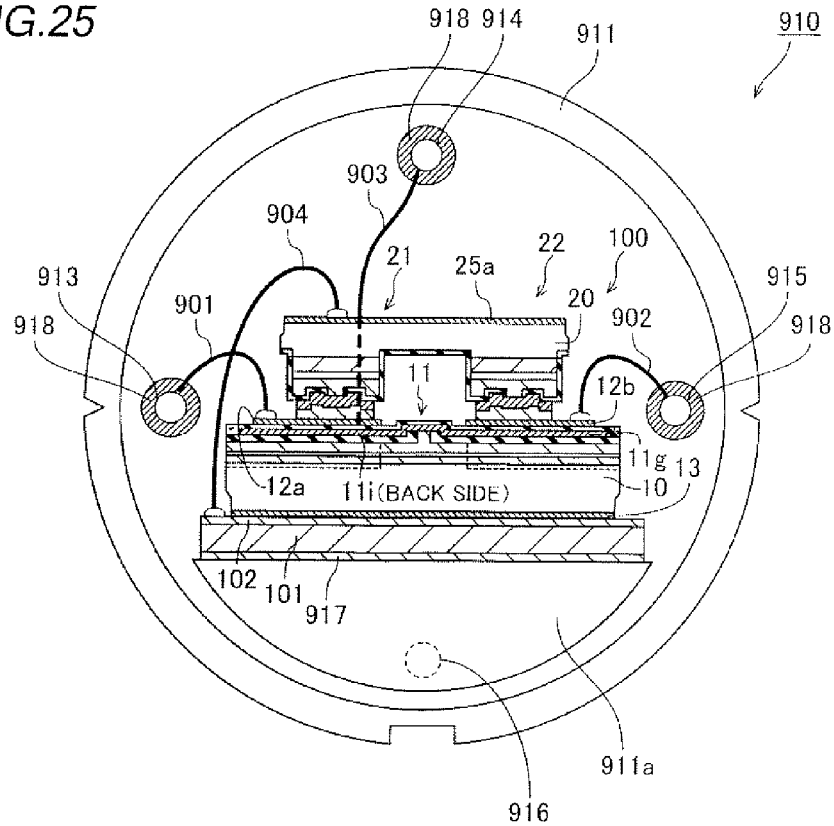
FIG. 25 is a front elevational view of a state where a lid body of a can package of the semiconductor laser apparatus mounted with the semiconductor laser device according to the seventh embodiment of the present invention is removed.

The semiconductor laser apparatus 910 has a base 911 made of a conductive material, a cap 912 arranged on a front surface of the base 911, leads 913, 914, 915 and 916 mounted on a rear surface of the base 911, as shown in FIGS. 24 and 25. The header 911a (see FIG. 25) is integrally formed with the base 911 on the front surface of the base 911. The semiconductor laser device 100 is arranged on an upper surface of the header 911a, and a submount (substrate) 101 (see FIG. 25) made of a conductive material such as Cu and the header 911a are fixed by a bonding layer 917 (see FIG. 25) made of Au—Sn solder. An optical window 912a (see FIG. 24) transmitting a laser beam emitted from the semiconductor laser device 100 is mounted on a front surface of the cap 912, and the semiconductor laser device 100 inside the base 911 covered with the cap 912 is sealed by the cap 912.

As shown in FIG. 25, the leads 913 to 915 pass through the base 911 and fixed to be electrically insulated from each other through insulating members 918. The lead 913 is electrically connected to a pad electrode 12a through a wire 901, and the lead 915 is electrically connected to a pad electrode 12b through a wire 901. The lead 914 is electrically connected to a wire bonding portion 11i (see FIG. 5 for a planar position) of a p-side electrode 11g through a wire 903. An n-side electrode 25a and a connecting electrode 102 on the submount 101 are electrically connected through a wire 904. The lead 916 is integrally formed with the base 911. Thus, the lead 916 and an n-side electrode 13 of the blue-violet semiconductor laser device portion 11 as well as the lead 916 and the n-side electrode 25a of the red semiconductor laser device portion 21 (infrared semiconductor laser device portion 22) are electrically connected, and cathode common connection of the blue-violet semiconductor laser device portion 11 and a red semiconductor laser device portion 21 (infrared semiconductor laser device portion 22) is achieved.

The optical system 920 has a polarizing beam splitter (PBS) 921, a collimator lens 922, beam expander 923, a λ/4 plate 924, an objective lens 925, a cylindrical lens 926 and an optical axis correction device 927, as shown in FIG. 23.

The PBS 921 totally transmits the laser beam emitted from the semiconductor laser device 910 and totally reflects the laser beam returned from an optical disc 980. The collimator lens 922 converts the laser beam from the semiconductor laser device 100 transmitting through the PBS 921 to parallel light. The beam expander 923 includes a concave lens, a convex lens and an actuator (not shown). The actuator has a function of correcting a state of wavefront of the laser beam emitted from the semiconductor laser apparatus 910 by changing a distance of the concave lens and the convex lens in response to a servo signal from the servo circuit described later.

The λ/4 plate 924 converts a linearly-polarized laser beam converted to substantially parallel light by the collimator lens 922 to circularly-polarized light. The λ/4 plate 924 converts the circularly-polarized laser beam returned from the optical disc 935 to linearly-polarized light. A direction of polarization of linearly-polarized light in this case is perpendicular to a direction of linear polarization of the laser beam emitted from the semiconductor laser apparatus 910. Thus, the laser beam returned from the optical disc 935 is totally reflected by the PBS 921. The objective lens 925 converges the laser beam transmitted through the λ/4 plate 924 on a surface (recording layer) of the optical disc 935. The objective lens 925 is movable in a focus direction, a tracking direction and a tilt direction in response to a servo signal (a tracking servo signal, a focus servo signal and a tilt servo signal) from the servo circuit described later by an objective lens actuator (not shown).

The cylindrical lens 926, optical axis correction device 927 and the light detection portion 930 are arranged along an optical axis of the laser beam totally reflected by the PBS 921. The cylindrical lens 926 gives astigmatic action to an incident laser beam. The optical axis correction device 927 is formed by diffraction grating and so arranged that a spot of zero-order diffracted light of each of blue-violet, red and infrared laser beams transmitted through the cylindrical lens 926 coincides on a detection region of the light detection portion 930 described later.

The light detection portion 930 outputs a playback signal on the basis of intensity distribution of a received laser beam. The light detection portion 930 has a prescribed patterned detection region to obtain the playback signal as well as a focus error signal, a tracking error signal and a tilt error signal. Thus, the optical pickup 900 comprising the semiconductor laser apparatus 910 is formed.

In this optical pickup 900, the semiconductor laser apparatus 910 is so formed that blue-violet, red and infrared laser beams independently emit from the blue-violet, red and infrared semiconductor laser device portions 11, 21 and 22 by independently applying voltages between the lead 916 and the leads 913 to 915, respectively. As hereinabove described, the laser beams emitted from the semiconductor laser apparatus 910 are adjusted by the PBS 921, the collimator lens 922, the beam expander 923, the λ/4 plate 924, the objective lens 925, cylindrical lens 926 and the optical axis correction device 927, and thereafter irradiated on the detection region of the light detection portion 930.

When data recorded in the optical disc 935 is playback, the laser beams are applied to the recording layer of the optical disc 935 and the playback signal output from the light detection portion 930 can be obtained while controlling respective laser power emitted from the blue-violet, red and infrared semiconductor laser device portions 11, 21 and 22 to be constant. The actuator of the beam expander 923 and the objective lens actuator driving the objective lens 925 can be feedback-controlled by the focus error signal, the tracking error signal and the tilt error signal simultaneously output.

When data is recorded in the optical disc 935, the laser beams are applied to the optical disc 935 while controlling laser power emitted from the blue-violet semiconductor laser device portion 11 and the red semiconductor laser device portion 21 (infrared semiconductor laser device portion 22) on the basis of data to be recorded. Thus, the data can be recorded in the recording layer of the optical disc 935. Similarly to the above, the actuator of the beam expander 923 and the objective lens actuator driving the objective lens 925 can be feedback-controlled by the focus error signal, the tracking error signal and the tilt error signal output from the light detection portion 930.

Thus, record in the optical disc 935 and playback can be performed with the optical pickup 900 comprising the semiconductor laser apparatus 910.

In the optical pickup 900 of the seventh embodiment, the semiconductor laser device 100 is mounted in the semiconductor laser apparatus 910, and hence the optical pickup 900 comprising the semiconductor laser device 100 in which cavity facets 11j, 21g, and 22g (see FIG. 5) of blue-violet, red and infrared semiconductor laser device portions 11, 21 and 22 are easily located on the same surface can be obtained.

Eight Embodiment

An optical disc apparatus 5000 according to an eight embodiment of the present invention will be described with reference to FIGS. 5, 23 and 26. The optical disc apparatus 5000 is an example of the "light apparatus" in the present invention.

Figure 26:
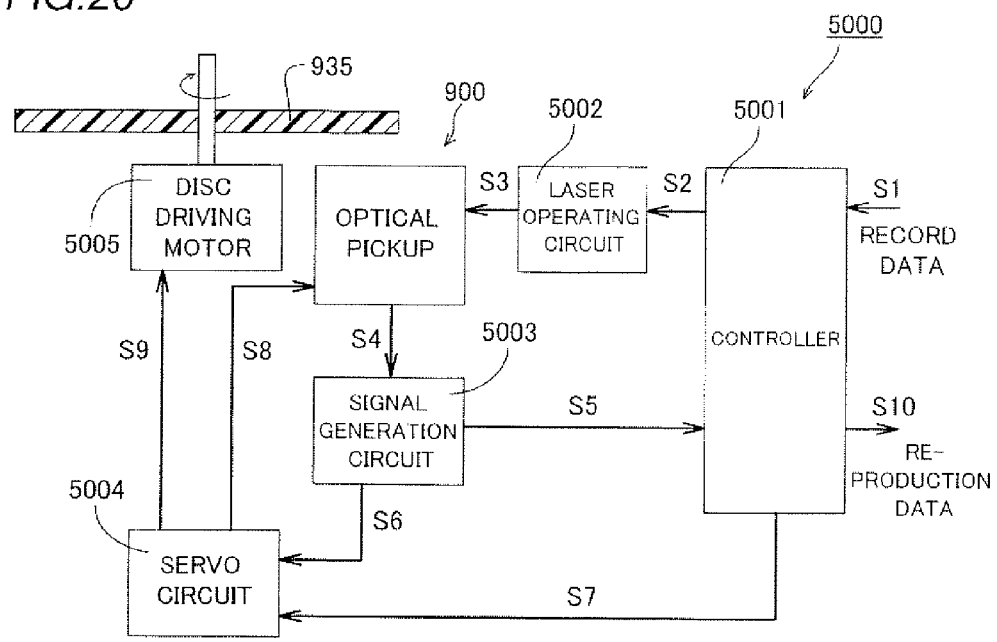
FIG. 26 is a block diagram of an optical disc apparatus comprising an optical pickup mounted with a semiconductor laser device according to an eight embodiment of the present invention.

The optical disc apparatus 5000 according to the eight embodiment of the present invention comprises the optical pickup 900 according to the aforementioned seventh embodiment, a controller 5001, a laser operating circuit 5002, a signal generation circuit 5003, a servo circuit 5004 and a disc driving motor 5005, as shown in FIG. 26.

Recorded data S1 generated on the basis of data to be recorded in the optical disc 935 is inputted in the controller 5001. The controller 5001 outputs a signal S2 to the laser operating circuit 5002 and outputs a signal S7 to the servo circuit 5004 in response to the record data S1 and a signal S5 from the signal generation circuit 5003 described later. The controller 5001 outputs playback data S10 on the basis of the signal S5, as described later. The laser operating circuit 5002 outputs a signal S3 controlling laser power emitted from the semiconductor laser apparatus 910 in the optical pickup 900 in response to the aforementioned signal S2. In other words, the semiconductor laser apparatus 910 is formed to be driven by the controller 5001 and the laser operating circuit 5002.

In the optical pickup 900, a laser beam controlled in response to the aforementioned signal S3 is applied to the optical disc 935, as show in FIG. 26. A signal S4 is output from the light detection portion 930 in the optical pickup 900 to the signal generation circuit 5003. The optical system 920 (the actuator of the beam expander 923 and the objective lens actuator driving the objective lens 925) in the optical pickup 900 is controlled by a servo signal S8 from the servo circuit 5004 described later. The signal generation circuit 5003 performs amplification and arithmetic processing for the signal S4 output from the optical pickup 900, to output the first output signal S5 including a playback signal to the controller 5001 and to output a second output signal S6 performing the aforementioned feed-back control of the optical pickup 900 and rotational control, described later, of the optical disc 935 to the servo circuit 5004.

As shown in FIG. 26, the servo circuit 5004 outputs the servo signal S8 controlling the optical system 920 in the optical pickup 900 and a motor servo signal S9 controlling the disc driving motor 5005 in response to the second output signal S6 and the signal S7 from the signal generation circuit 5003 and the controller 5001. The disc driving motor 5005 controls a rotational speed of the optical disc 935 in response to the motor servo signal S9.

When data recorded in the optical disc 935 is playback, a laser beam having a wavelength to be applied is first selected by means identifying types (CD, DVD, BD, etc.) of the optical disc 935 which is not described here. Then, the signal S2 is so output from the controller 5001 to the laser operating circuit 5002 that an intensity of the laser beam having the wavelength to be emitted from the semiconductor laser apparatus 910 in the optical pickup 900 is constant. Further, the signal S4 including a playback signal is output from the light detection portion 930 to the signal generation circuit 5003 by functioning the semiconductor laser apparatus 910, the optical system 920 and the light detection portion 930 of the optical pickup 900 described above, and the signal generation circuit 5003 outputs the signal S5 including the playback signal to the controller 5001. The controller 5001 processes the signal S5, so that the playback signal recorded in the optical disc 935 is extracted and output as the reproduction data S10. Information such as images and sound recorded in the optical disc 935 can be output to a monitor, a speaker and the like with this playback data S10, for example. Feed-back control of each portion is performed on the basis of the signal S4 from the light detection portion 930.

When data is recorded in the optical disc 935, the laser beam having the wavelength to be applied is selected by the means identifying types (CD, DVD, BD, etc.) of the optical disc 935, similarly to the above. Then, the signal S2 is output from the controller 5001 to the laser operating circuit 5002 in response to the record data S1 responsive to recorded data. Further, data is recorded in the optical disc 935 by functioning the semiconductor laser apparatus 910, the optical system 920 and the light detection portion 930 of the optical pickup 900 described above, and feed-back control of each portion is performed on the basis of the signal S4 from the light detection portion 930.

Thus, record in the optical disc 935 and playback can be performed with the optical disc apparatus 5000.

In the optical disc apparatus 5000 according to the eight embodiment, the semiconductor laser device 100 (see FIG. 23) is mounted in the semiconductor laser apparatus 910 (see FIG. 23), and hence the optical disc apparatus 5000 comprising the semiconductor laser device 100 in which cavity facets 11j, 21g, and 22g (see FIG. 5) of blue-violet, red and infrared semiconductor laser device portions 11, 21 and 22 are easily located on the same surface can be obtained.

Ninth Embodiment

A structure of a projector 6000 according to a ninth embodiment of the present invention will be described with reference to FIGS. 1, 27 and 28. In the projector 6000, each of semiconductor laser devices constituting a semiconductor laser apparatus 940 is substantially simultaneously turned on. The projector 6000 is an example of the "light apparatus" in the present invention.

Figure 28:
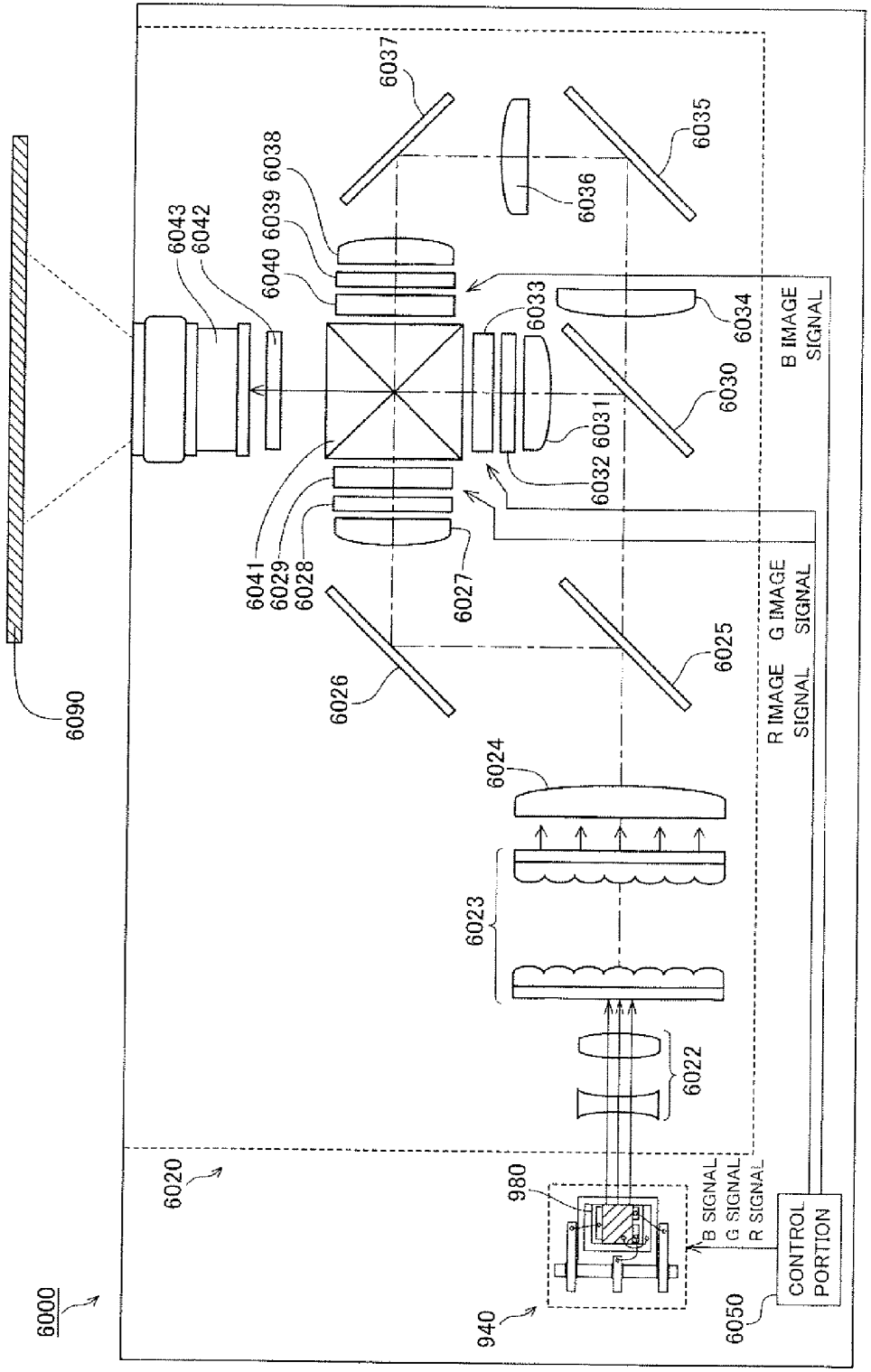
FIG. 28 is a block diagram of a projector mounted with a semiconductor laser device according to the ninth embodiment of the present invention.

The projector 6000 according to the ninth embodiment of the present invention comprises the semiconductor laser apparatus 940, an optical system 6020 consisting of a plurality of optical components and a control portion 6050 controlling the semiconductor laser apparatus 940 and the optical system 6020, as shown in FIG. 28. Thus, laser beams emitted from the semiconductor laser apparatus 940 are modulated by the optical system 6020 and thereafter projected on an external screen 6090 or the like.

Figure 27:
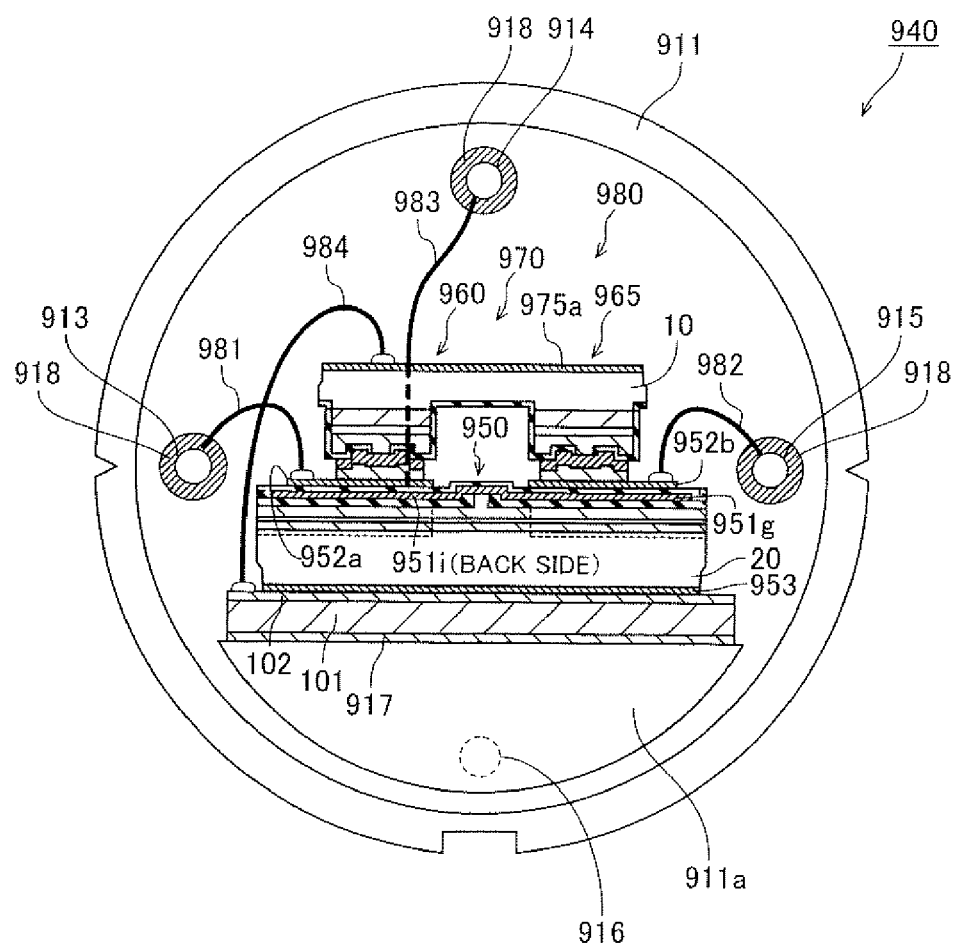
FIG. 27 is a front elevational view showing a structure of a semiconductor laser apparatus mounted with a semiconductor laser device according to a ninth embodiment of the present invention.

As shown in FIG. 27, the semiconductor laser apparatus 940 comprises an RGB three-wavelength semiconductor laser device 980 formed by bonding a red semiconductor laser device portion 950 having a lasing wavelength of about 655 nm of red (R) onto a two-wavelength semiconductor laser device 970 monolithically formed with a green semiconductor laser device portion 960 having a lasing wavelength of about 530 nm of green (G) and a blue semiconductor laser device portion 965 having a lasing wavelength of about 480 nm of blue (B), and capable of emitting laser beams of three-wavelengths of RGB.

The RGB three-wavelength semiconductor laser device 980 comprises the red semiconductor laser device portion 950 formed on an upper surface of an n-type GaAs substrate 20 instead of the blue-violet semiconductor laser device portion 11, and the two-wavelength semiconductor laser device portion 970 monolithically formed with the green semiconductor laser device portion 960 and the blue semiconductor laser device portion 965 on a lower surface of an n-type GaN substrate 10 instead of the two-wavelength semiconductor laser device portion 30 monolithically formed with the red and infrared semiconductor laser device portions 21 and 22, with reference to the semiconductor laser device 100 of the first embodiment shown in FIG. 1. The remaining structure and manufacturing process of the RGB three-wavelength semiconductor laser device 980 are similar to those of the semiconductor laser device 100 of the aforementioned first embodiment.

In the RGB three-wavelength semiconductor laser device 980, an n-side electrode 953 is electrically connected and fixed on an upper surface of a submount 101 through a bonding layer 917 made of Au—Sn solder or the like.

The "first semiconductor laser device" in the present invention is constituted by the n-type GaAs substrate 20 and the red semiconductor laser device portion 950, and the "second semiconductor laser device" in the present invention is constituted by the n-type GaN substrate 10 and the two-wavelength semiconductor laser device portion 970 consisting of the green semiconductor laser device portion 960 and the blue semiconductor laser device portion 965.

A lead 913 is electrically connected to a pad electrode 952a conducting with a p-type semiconductor layer of the green semiconductor laser device portion 960 through a wire 981, and a lead 915 is electrically connected to a pad electrode 952b conducting with a p-type semiconductor layer of the blue semiconductor laser device portion 965 through a wire 982. A lead 914 is electrically connected to a p-side electrode 951g (wire bonding portion 951i) of the red semiconductor laser device portion 950 through a wire 983. An n-side electrode 975a of the two-wavelength semiconductor laser device 970 and a connecting electrode 102 on the submount 101 are electrically connected through a wire 984. Thus, a lead 916 and the n-side electrode 953 of the red semiconductor laser device portion 950 as well as the lead 916 and the n-side electrode 975a of the two-wavelength semiconductor laser device 970 are electrically connected, and cathode common connection of the red semiconductor laser device portion 950 and the two-wavelength semiconductor laser device 970 is achieved. The pad electrodes 952a and 952b are each an example of the "electrode layer" in the present invention.

In the optical system 6020, the laser beams emitted from the semiconductor laser apparatus 940 are converted to parallel beams having prescribed beam diameters by a dispersion angle control lens 6022 consisting of a concave lens and a convex lens, and thereafter introduced into a fly-eye integrator 6023, as shown in FIG. 28. The fly-eye integrator 6023 is so formed that two fly-eye lenses consisting of fly-eye lens groups face each other, and provides a lens function to the beams introduced from the dispersion angle control lens 6022 so that light quantity distributions in incidence upon liquid crystal panels 6029, 6033 and 6040 are uniform. In other words, the beams transmitted through the fly-eye integrator 6023 are so adjusted that the same can be incident upon the liquid crystal panels 6029, 6033 and 6040 with spreads of aspect ratios (16:9, for example) corresponding to the sizes of the liquid crystal panels 6029, 6033 and 6040.

The beams transmitted through the fly-eye integrator 6023 are condensed by a condenser lens 6024. In the beams transmitted through the condenser lens 6024, only the red beam is reflected by a dichroic mirror 6025, while the green and blue beams are transmitted through the dichroic mirror 6025.

The red beam is parallelized by a lens 6027 through a mirror 6026, and thereafter incident upon the liquid crystal panel 6029 through an incidence-side polarizing plate 6028. The liquid crystal panel 6029 is driven in response to a red image signal (R image signal), thereby modulating the red beam.

In the beams transmitted through a dichroic mirror 6025, only the green beam is reflected by the dichroic mirror 6030, while the blue beam is transmitted through the dichroic mirror 6030.

The green beam is parallelized by a lens 6031, and thereafter incident upon the liquid crystal panel 6033 through an incidence-side polarizing plate 6032. The liquid crystal panel 6033 is driven in response to a green image signal (G image signal), thereby modulating the green beam.

The blue beam transmitted through the dichroic mirror 6030 passes through a lens 6034, a mirror 6035, a lens 6036 and a mirror 6037, is parallelized by a lens 6038, and thereafter incident upon the liquid crystal panel 6040 through an incidence-side polarizing plate 6039. The liquid crystal panel 6040 is driven in response to a blue image signal (B image signal), thereby modulating the blue beam.

Thereafter the red, green and blue beams modulated by the liquid crystal panels 6029, 6033 and 6040 are synthesized by a dichroic prism 6041, and thereafter introduced into a projection lens 6043 through an emission-side polarizing plate 6042. The projection lens 6043 stores a lens group for imaging projected light on a projected surface (screen 6090) and an actuator for adjusting the zoom and the focus of the projected image by partially displacing the lens group in an optical axis direction.

In the projector 6000, the control portion 6050 controls to supply stationary voltages as an R signal related to driving of the red semiconductor laser device portion 950, a G signal related to driving of the green semiconductor laser device portion 960 and a B signal related to driving of the blue semiconductor laser device portion 965 to the respective laser devices of the semiconductor laser apparatus 940. Thus, the red, green and blue semiconductor laser device portions 950, 960 and 965 of the semiconductor laser apparatus 940 are substantially simultaneously drived. The control portion 6050 is formed to control the intensities of the beams emitted from the red, green and blue semiconductor laser device portions 950, 960 and 965 of the semiconductor laser apparatus 940, thereby controlling the hue, brightness etc. of pixels projected on the screen 6090. Thus, the control portion 6050 projects a desired image on the screen 6090.

The projector 6000 loaded with the semiconductor laser apparatus 940 according to the first embodiment of the present invention is constituted in the aforementioned manner.

Tenth Embodiment

A structure of a projector 6500 according to a tenth embodiment of the present invention will be described with reference to FIGS. 27, 29 and 30. In the projector 6500, each of semiconductor laser devices constituting a semiconductor laser apparatus 940 is turned on in a time-series manner. The projector 6500 is an example of the "light apparatus" in the present invention.

Figure 29:
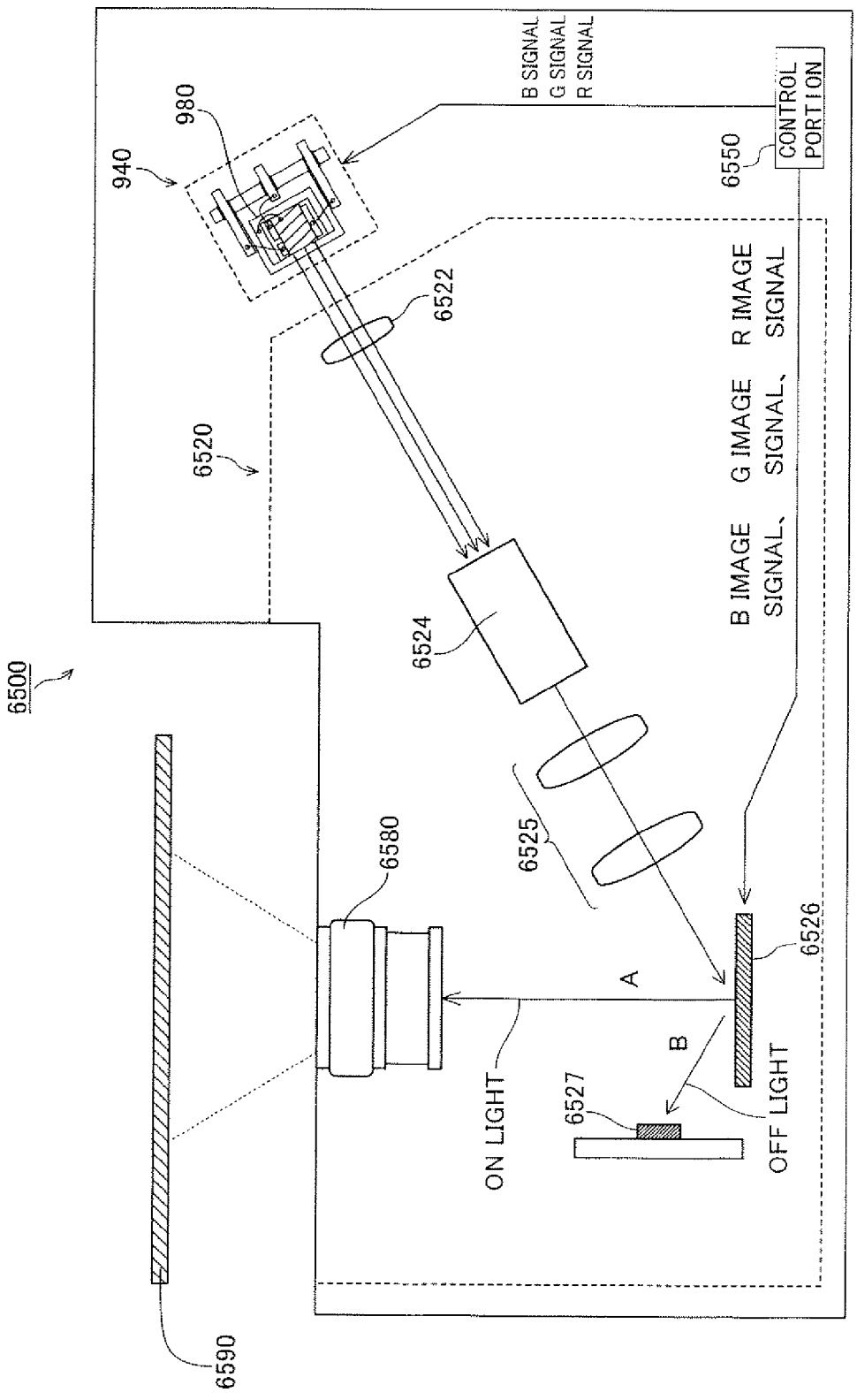
FIG. 29 is a block diagram of a projector mounted with a semiconductor laser device according to a tenth embodiment of the present invention.

The projector 6500 according to the tenth embodiment of the present invention comprises the semiconductor laser apparatus 940 employed in the aforementioned ninth embodiment, an optical system 6520, and a control portion 6550 controlling the semiconductor laser apparatus 940 and the optical system 6520, as shown in FIG. 29. Thus, beams emitted from the semiconductor laser apparatus 940 are modulated by the optical system 6520 and thereafter projected on a screen 6590 or the like.

In the optical system 6520, the beams emitted from the semiconductor laser apparatus 940 are converted to parallel beams by a lens 6522, and thereafter introduced into a light pipe 6524.

The light pipe 6524 has a specular inner surface, and the laser beams are repeatedly reflected by the inner surface of the light pipe 6524 to travel in the light pipe 6524. At this time, intensity distributions of the beams of respective colors emitted from the light pipe 6524 are uniformized due to multiple reflection in the light pipe 6524. The beams emitted from the light pipe 6524 are introduced into a digital micromirror device (DMD) 6526 through a relay optical system 6525.

The DMD 6526 consists of a group of small mirrors arranged in the form of a matrix. The DMD 6526 has a function of expressing (modulating) gradation of each pixel by switching a direction of reflection of light on each pixel position between a first direction A toward a projection lens 6580 and a second direction B deviating from the projection lens 6580. Light (ON-light) incident upon each pixel position and reflected in the first direction A is introduced into the projection lens 6580 and projected on a projected surface (screen 6590). On the other hand, light (OFF-light) reflected by the DMD 6526 in the second direction B is not introduced into the projection lens 6580 but absorbed by a light absorber 6527.

In the projector 6500, the control portion 6550 controls to supply a pulse voltage to the semiconductor laser apparatus 940, thereby dividing the red, green and blue semiconductor laser device portions 950, 960 and 965 of the semiconductor laser apparatus 940 in a time-series manner and cyclically driving the same one by one. Further, the control portion 6550 is so formed that the DMD 6526 of the optical system 6520 modulates light in response to the gradations of the respective pixels (R, G and B) in synchronization with the driving of the red, green and blue semiconductor laser device portions 950, 960 and 965.

Figure 30:
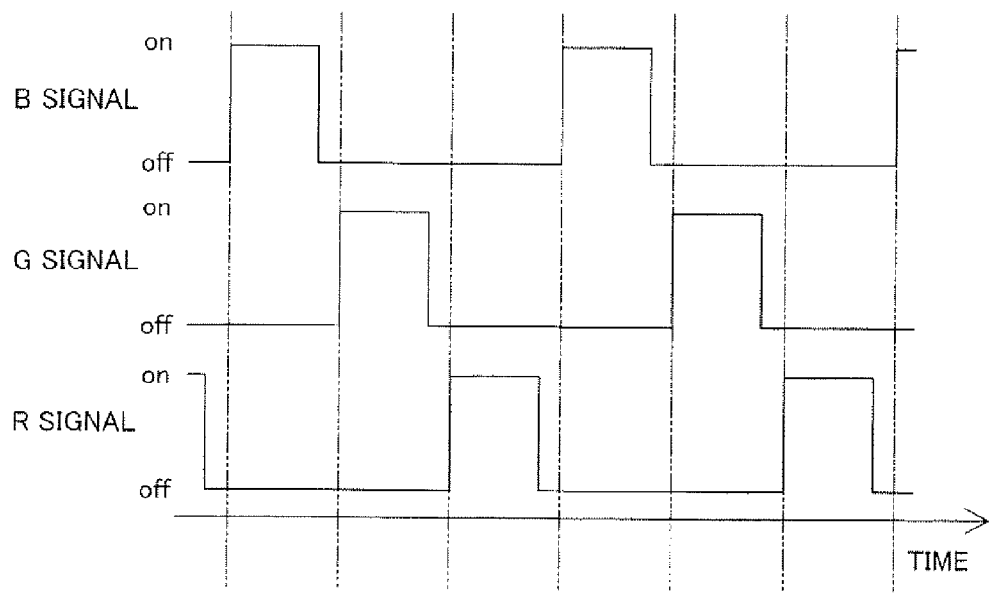
FIG. 30 is a timing chart showing a state where a control portion transmits signals in a time-series manner in the projector mounted with the semiconductor laser device according to the tenth embodiment of the present invention.

More specifically, an R signal related to driving of the red semiconductor laser device portion 950 (see FIG. 27), a G signal related to driving of the green semiconductor laser device portion 960 (see FIG. 27) and a B signal related to driving of the blue semiconductor laser device portion 965 (see FIG. 27) are divided in a time-series manner not to overlap with each other and supplied to the respective laser devices of the semiconductor laser apparatus 940 by the control portion 6550 (see FIG. 29), as shown in FIG. 30. In synchronization with the B, G and R signals, the control portion 6550 outputs a B image signal, a G image signal and an R image signal to the DMD 6526.

Thus, the blue semiconductor laser device portion 965 emits a blue beam on the basis of the B signal in a timing chart shown in FIG. 30, while the DMD 6526 modulates the blue beam at this timing on the basis of the B image signal. Further, the green semiconductor laser device portion 960 emits a green beam on the basis of the G signal output subsequently to the B signal, and the DMD 6526 modulates the green beam at this timing on the basis of the G image signal. In addition, the red semiconductor laser device portion 950 emits a red beam on the basis of the R signal output subsequently to the G signal, and the DMD 6526 modulates the red beam at this timing on the basis of the R image signal. Thereafter the blue semiconductor laser device portion 965 emits the blue beam on the basis of the B signal output subsequently to the R signal, and the DMD 6526 modulates the blue beam again at this timing on the basis of the B image signal. The aforementioned operations are so repeated that an image formed by application of the laser beams based on the B, G and R image signals is projected on the projected surface (screen 6590).

The projector 6500 loaded with the semiconductor laser apparatus 940 according to the tenth embodiment of the present invention is constituted in the aforementioned manner.

Although the present invention has been described and illustrated in detail, it is clearly understood that the same is by way of illustration and example only and is not to be taken by way of limitation, the spirit and scope of the present invention being limited only by the terms of the appended claims.

Figure 31:
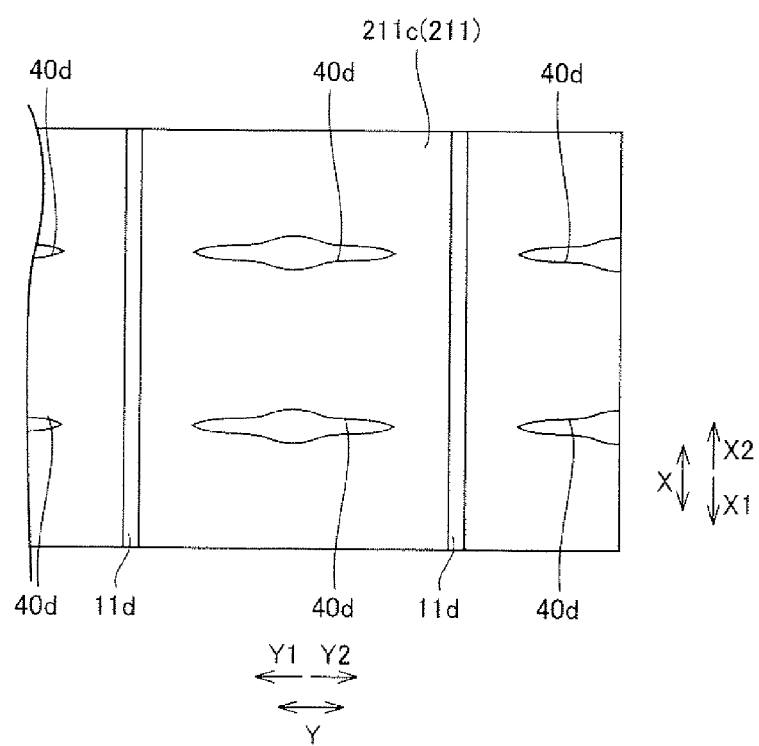
FIG. 31 is a top plan view showing shapes of first cleavage guide grooves formed in a process of manufacturing a semiconductor laser device according to a first modification of the present invention.
Figure 32:
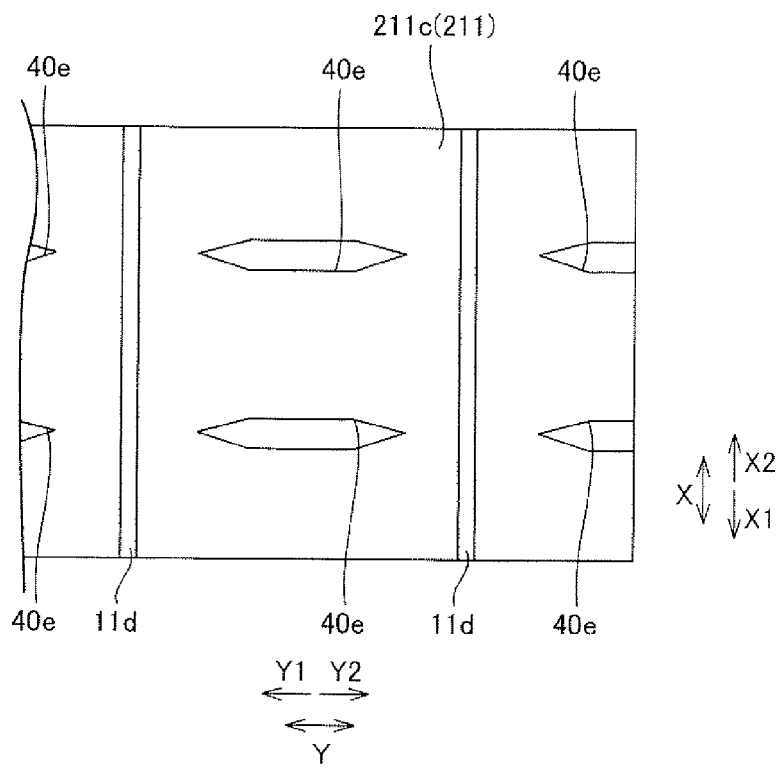
FIG. 32 is a top plan view showing shapes of first cleavage guide grooves formed in a process of manufacturing a semiconductor laser device according to a second modification of the present invention
Figure 33:
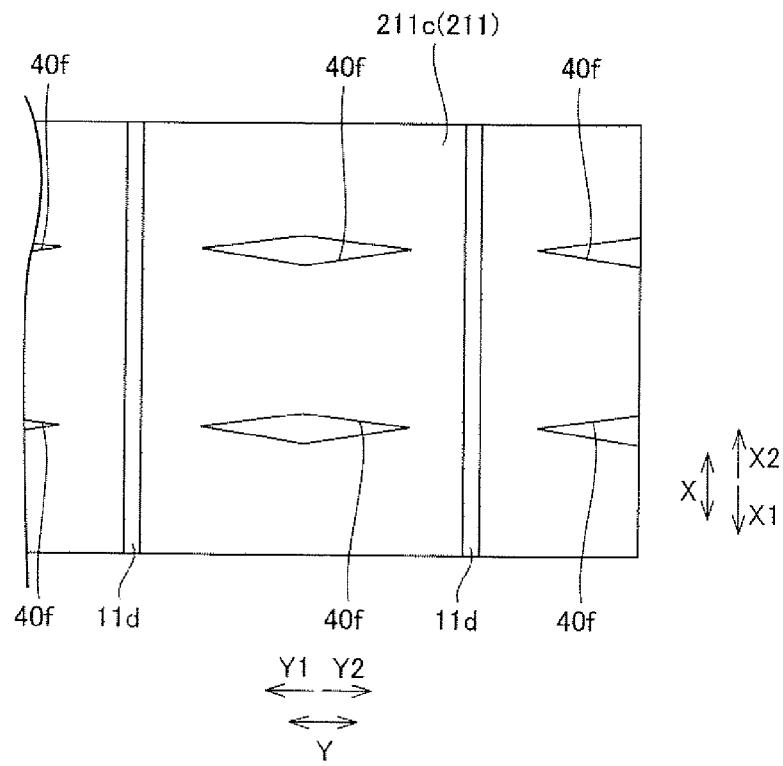
FIG. 33 is a top plan view showing shapes of first cleavage guide grooves formed in a process of manufacturing a semiconductor laser device according to a third modification of the present invention.

For example, while the first cleavage guide grooves (see FIGS. 6 and 7) are formed to have the substantially rectangular shapes as viewed from the Z1 side in each of the aforementioned first to tenth embodiments, the present invention is not restricted to this. In the present invention, both ends of each first cleavage guide groove 40*d* may be formed in wedge shapes where corners are located on the ends on Y1 and Y2 sides which are directions perpendicular to a ridge 11*d*, and has a rhombic shape having rounded portions (substantially central portion in a direction Y) other than the corners located on the Y1 and Y2 sides, as in a first modification shown in FIG. 31. Alternatively, in the present invention, both ends of each of first cleavage guide grooves 40*e* may be formed in wedge shapes where corners are located on ends on Y1 and Y2 sides which are directions perpendicular to a ridge 11*d*, and has a hexagonal shape having a central portion linearly extending in a direction Y, as in a second modification shown in FIG. 32. Alternatively, in the present invention, each of first cleavage guide grooves 40*f* may be formed to have a laterally long rhombic shape having corners located on Y1 and Y2 sides which are directions perpendicular to a ridge 11*d*, as in a third modification shown in FIG. 33. According to the structures according to the first to third modifications, cracks are easily formed between the adjacent first cleavage guide grooves in the direction Y from the corners on the Y1 and Y2 sides when cleaving the wafer-state semiconductor laser device, and hence the wafer-state semiconductor laser device can be easily cleaved. The first cleavage guide grooves 40*d*, 40*e* and 40*f* are each an example of the "first groove" in the present invention.

While the first and second cleavage guide grooves, and the first, second and third device division grooves are provided on the semiconductor laser devices in each of the aforementioned first to tenth embodiments, the present invention is not restricted to this. In the present invention, all of the second cleavage guide grooves, and the first, second and third device division grooves except the first cleavage guide grooves may not be provided on the semiconductor laser devices. The cleavage guide grooves and the device division grooves may be provided after previously patterning portions to be provided with the cleavage guide grooves and the device division grooves. Thus, the cleavage guide grooves and the device division grooves can be more precisely provided.

While the first cleavage guide grooves are formed after forming the blue-violet semiconductor laser device portion in each of the aforementioned first to tenth embodiments, the present invention is not restricted to this. In the present invention, the first cleavage guide grooves may be formed after forming the first insulating layer on the upper surface of the blue-violet semiconductor laser device portion, or the first cleavage guide grooves may be formed after forming the p-side electrode and the second insulating layer. In other words, the first cleavage guide grooves may be formed at any stage so far as it is formed before the wafer-state n-type GaN substrate side and the wafer-state n-type GaAs substrate side are bonded to each other.

While the first cleavage guide grooves and the first device division grooves are formed by photolithography and etching, and the second cleavage guide grooves and the second and third device division grooves are formed with a diamond point in each of the aforementioned first to tenth embodiments, the present invention is not restricted to this. In the present invention, the cleavage guide grooves and the device division grooves may be formed by photolithography and etching, or with the diamond point or a laser beam.

While the semiconductor laser device is the two-wavelength semiconductor laser device including the blue-violet and red semiconductor laser device portions in each of the aforementioned fourth and fifth embodiments, the present invention is not restricted to this. In the present invention, the semiconductor laser device is not restricted to combination of the blue-violet and red semiconductor laser device portions, but it may be a two-wavelength semiconductor laser device including blue-violet and infrared semiconductor laser device portions, for example.

While the semiconductor laser device is formed by the two- or three-wavelength semiconductor laser device in each of the aforementioned first to tenth embodiments, the present invention is not restricted to this. In the present invention, the semiconductor laser device is not restricted to the two- or three-wavelength semiconductor laser device so far as the semiconductor laser device is formed by bonding. For example, a plurality of single-wavelength semiconductor laser device portions may be bonded to each other, or semiconductor laser device portions having at least four different wavelengths may be bonded.

While the fusion layers are made of Au—Sn solder in each of the aforementioned first to tenth embodiments, the present invention is not restricted to this. In the present invention, the fusion layers may be made of solder materials such as Au, Sn, In, Pb, Ge, Ag, Cu or Si or alloy materials thereof. Alternatively, other bonding method not employing solder may be employed.

While the p-side electrodes and the n-side electrodes on the n-type GaAs substrate side are formed by being alloyed by thermal treatment before bonding a plurality of the fusion layers and a plurality of the p-side electrodes in each of the aforementioned first to tenth embodiments, the present invention is not restricted to this. In the present invention, the p-side electrodes and the n-side electrodes on the n-type GaAs substrate side may not be alloyed. Alternatively, the n-side electrodes on the n-type GaAs substrate side may be formed after bonding the plurality of fusion layers and the plurality of p-side electrodes in a case where alloying is not required or in a case where a temperature of thermal treatment in alloying is smaller than a melting temperature of the fusion layers.

While the p-type cladding layer of the red or infrared semiconductor laser device portion has the projecting portion, the recess portions formed on the both sides of the projecting portion, and the planar portions extending to the both sides of the recess portions and located below the lower surface of the projecting portion in each of the aforementioned first to tenth embodiments, the present invention is not restricted to this. In the present invention, the p-type cladding layer of the red or infrared semiconductor laser device portion may have a projecting portion and planar portions extending to the both sides of the projecting portion. In other words, no recess portion may not be provided on the red and infrared semiconductor laser device portions.

While the n-type GaN substrate and the n-type GaAs substrate are employed as a substrate in each of the aforementioned first to tenth embodiments, the present invention is not restricted to this. In the present invention, other substrate such as a GaP substrate and a Si substrate may be employed.

While the first device division grooves of the n-type GaAs substrate and the groove are formed to have substantially the same depth in each of the aforementioned first to tenth embodiments, the present invention is not restricted to this. In the present invention, depths of the first device division grooves and the groove may be different.

Figure 34:
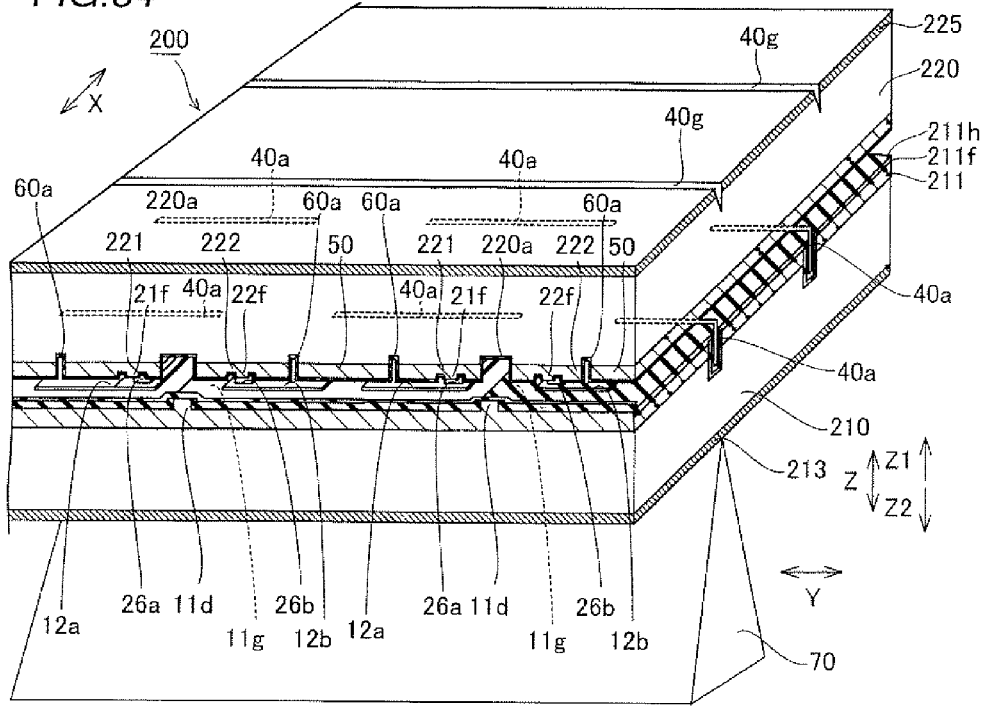
FIG. 34 is a top plan view showing shapes of second cleavage guide grooves formed in a process of manufacturing a semiconductor laser device according to a fourth modification of the present invention.
Figure 35:
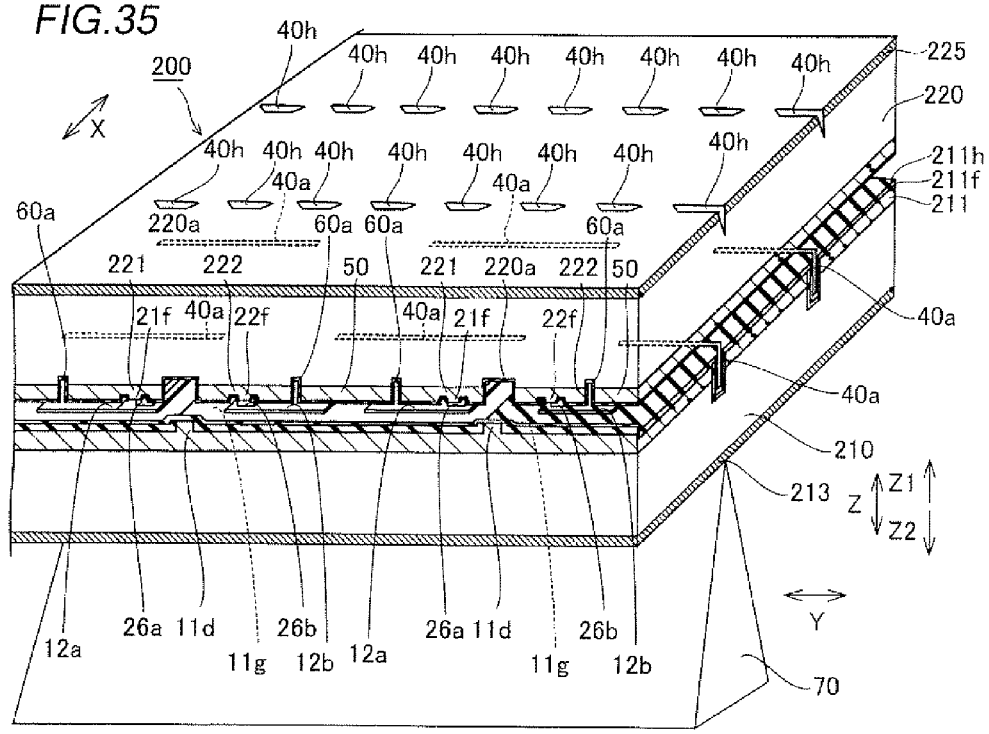
FIG. 35 is a top plan view showing shapes of second cleavage guide grooves formed in a process of manufacturing a semiconductor laser device according to a fifth modification of the present invention.

The "second grooves" of the present invention may be not only the broken-line shaped grooves employed in each of the aforementioned first to tenth embodiments, or the groove formed only on both ends on the Y sides of the wafer-state n-type GaAs substrate 220 but also second cleavage guide grooves 40g continuously linearly formed as in a fifth modification shown in FIG. 34 or second cleavage guide grooves 40h formed in the form of dotted lines having shorter length and interval than the second cleavage guide grooves 40c (see FIG. 15) as in a sixth modification shown in FIG. 35. In the case of FIG. 35, the groove portions having a length of about 50 µm can be formed at intervals of about 50 µm. The lengths and intervals of the second cleavage guide grooves 40h may not be equal to each other and may be independently changed.

In the RGB three-wavelength semiconductor laser device 980 employed in each of the aforementioned ninth and tenth embodiments, the green semiconductor laser device portion 960 or the blue semiconductor laser device portion 965 may be bonded onto the upper portion of the ridge of the red semiconductor laser device portion 950 similarly to the semiconductor laser device 400 of the second embodiment, or may be so bonded that the n-type GaN substrate 10 of the green and blue semiconductor laser device portions 960 and 965 is not located on the upper portion of the ridge of the red semiconductor laser device portion 950 similarly to the semiconductor laser device 500 of the third embodiment.

The two-wavelength semiconductor laser device 970 formed by the green and blue semiconductor laser device portions 960 and 965 is employed as the "first semiconductor laser device" of the present invention instead of the RGB three-wavelength semiconductor laser device 980 employed in each of the aforementioned ninth and tenth embodiments, and the red semiconductor laser device portion 950 may be employed as the "second semiconductor laser device" of the present invention. In this case, in the manufacturing process, removed portions between the red semiconductor laser device portions 950 are removed, and hence wire bonding portions of the two-wavelength semiconductor laser device 970 formed by the green and blue semiconductor laser device portions 960 and 965 are exposed outside. Thus, the RGB three-wavelength semiconductor laser device, in which the red semiconductor laser device portion 950 is directed upward when being mounted on the semiconductor laser apparatus, and the side of the two-wavelength semiconductor laser device 970 formed by the green and blue semiconductor laser device portions 960 and 965 is suitable for bonding onto a submount, can be constituted.

Thus, in the two-wavelength semiconductor laser device 970 formed by the green and blue semiconductor laser device portions 960 and 965, heat can be directly radiated to the submount, and also in the red semiconductor laser device portion 950, heat can be radiated to the submount through the two-wavelength semiconductor laser device 970 made of a nitride-based semiconductor having excellent thermal conductivity. Consequently, heat radiation capacity of the RGB three-wavelength semiconductor laser device can be further improved.

What is claimed is:

1. A semiconductor laser device comprising;
a first semiconductor laser device substrate including a first semiconductor laser device; and
a second semiconductor laser device substrate including a second semiconductor laser device,
wherein
said second semiconductor laser device is bonded onto a surface of said first semiconductor laser device, and
said first semiconductor laser device includes step portions consisting of portions, each of which was a part of the groove for cleavage in a state where said first and second semiconductor laser device substrates are bonded to each other, on said surface of said first semiconductor laser device.

2. The semiconductor laser device according to claim 1, wherein
said step portions are formed on regions except waveguides of said first semiconductor laser device and the vicinity thereof to extend along a direction substantially perpendicular to an extensional direction of said waveguides.

3. A light apparatus comprising:
a semiconductor laser device having a first semiconductor laser device substrate including a first semiconductor laser device and a second semiconductor laser device substrate including a second semiconductor laser device; and
an optical system controlling a light emitted from said semiconductor laser device, wherein
said second semiconductor laser device is bonded onto a surface of said first semiconductor laser device, and
said first semiconductor laser device has step portions consisting of portions, each of which was a part of the groove for cleavage in a state where said first and second semiconductor laser device substrates are bonded to each other, on said surface of said first semiconductor laser device.

* * * * *